US012148802B2

(12) United States Patent
Ji et al.

(10) Patent No.: US 12,148,802 B2
(45) Date of Patent: Nov. 19, 2024

(54) VERTICAL STRING DRIVER WITH CHANNEL FIELD MANAGEMENT STRUCTURE

(71) Applicant: Intel NDTM US LLC, Santa Clara, CA (US)

(72) Inventors: Dong Ji, Santa Clara, CA (US); Guangyu Huang, El Dorado Hills, CA (US); Deepak Thimmegowda, Fremont, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 1008 days.

(21) Appl. No.: 16/831,558

(22) Filed: Mar. 26, 2020

(65) Prior Publication Data

US 2020/0227525 A1    Jul. 16, 2020

(51) Int. Cl.
*H01L 29/40* (2006.01)
*H01L 21/28* (2006.01)
(Continued)

(52) U.S. Cl.
CPC ........ *H01L 29/402* (2013.01); *H01L 29/0649* (2013.01); *H01L 29/4011* (2019.08);
(Continued)

(58) Field of Classification Search
CPC .............. H01L 29/402; H01L 29/0649; H01L 29/4011; H01L 29/78642; H01L 29/7827; H01L 29/407; H10B 41/41; H10B 41/50; H10B 41/35; H10B 41/27; H10B 41/10; H10B 43/10; H10B 43/27; H10B 43/35; H10B 43/40; H10B 43/50
See application file for complete search history.

(56) References Cited

U.S. PATENT DOCUMENTS 7,851,858 B2 * 12/2010 Yoshino ............ H01L 29/78654
257/E21.32
8,552,496 B2 * 10/2013 Disney ................ H01L 29/0696
257/341
(Continued)

OTHER PUBLICATIONS

Abouelatta-Ebrahim, Mohamed, et. al., "Design considerations of high voltage RESURF nLDMOS: An analytical and numerical study", Ain Shams University, Ain Shams Engineering Journal, Available online Feb. 7, 2015, 9 pages.
(Continued)

*Primary Examiner* — Evren Seven
*Assistant Examiner* — Sarah L Ell
(74) *Attorney, Agent, or Firm* — Compass IP Law PC

(57) ABSTRACT

A driver circuit for a three-dimensional (3D) memory device has a field management structure electrically coupled to a gate conductor. The field management structure causes an electric field peak in a vertical channel of the 3D memory device when a voltage differential exists between the source conductor and the drain conductor and the gate conductor is not biased. The electrical field peak can adjust the electrical response of the driver circuit, enabling the circuit to have a higher breakdown threshold voltage and improved drive current. Thus, the driver circuit can enable a scalable vertical string driver that is above the memory array instead of under the memory array circuitry.

17 Claims, 19 Drawing Sheets

(51) Int. Cl.
*H01L 29/06* (2006.01)
*H10B 41/10* (2023.01)
*H10B 41/27* (2023.01)
*H10B 41/35* (2023.01)
*H10B 41/41* (2023.01)
*H10B 43/10* (2023.01)
*H10B 43/27* (2023.01)
*H10B 43/35* (2023.01)
*H10B 43/40* (2023.01)

(52) U.S. Cl.
CPC ............ *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H10B 43/40* (2023.02)

(56) References Cited

U.S. PATENT DOCUMENTS

| | | |
|---|---|---|
| 9,053,977 B2 | 6/2015 | Choi et al. |
| 9,209,199 B2 | 12/2015 | Simsek-Ege et al. |
| 9,490,322 B2 | 11/2016 | Yang et al. |
| 9,595,535 B1 | 3/2017 | Ogawa et al. |
| 9,653,556 B1* | 5/2017 | Yang .................. H01L 29/402 |
| 10,074,661 B2 | 9/2018 | Sakakibara et al. |
| 10,784,312 B1 | 9/2020 | Kabuyanagi et al. |
| 11,018,255 B2* | 5/2021 | Liu ..................... H01L 29/1037 |
| 11,088,163 B2 | 8/2021 | Kanamori et al. |
| 11,699,754 B2 | 7/2023 | Song et al. |
| 2008/0135929 A1* | 6/2008 | Saito ................... H01L 29/7802 257/330 |
| 2011/0215399 A1* | 9/2011 | Matsuura ............... H01L 29/78 257/E29.257 |
| 2012/0313691 A1 | 12/2012 | Mikhalev et al. |
| 2016/0240254 A1 | 8/2016 | Chen |
| 2019/0067475 A1 | 2/2019 | Liu et al. |
| 2019/0198515 A1 | 6/2019 | Hosoda et al. |
| 2020/0227429 A1 | 7/2020 | Ji et al. |
| 2021/0384354 A1 | 12/2021 | Karda et al. |

OTHER PUBLICATIONS

Extended European Search Report for Patent Application No. 20209733.3, Mailed May 14, 2021, 8 pages.
First Office Action for U.S. Appl. No. 16/831,623, Mailed Nov. 24, 2023, 13 pages.
Notice of Allowance for U.S. Appl. No. 16/831,623, Mailed May 9, 2024, 6 pages.

* cited by examiner

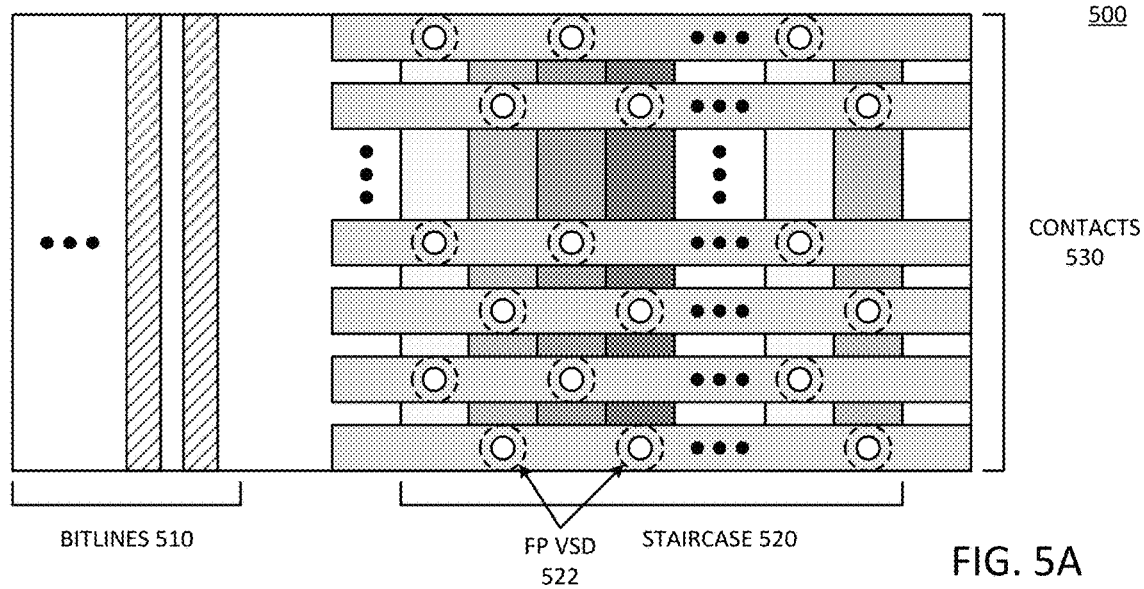
FIG. 5A
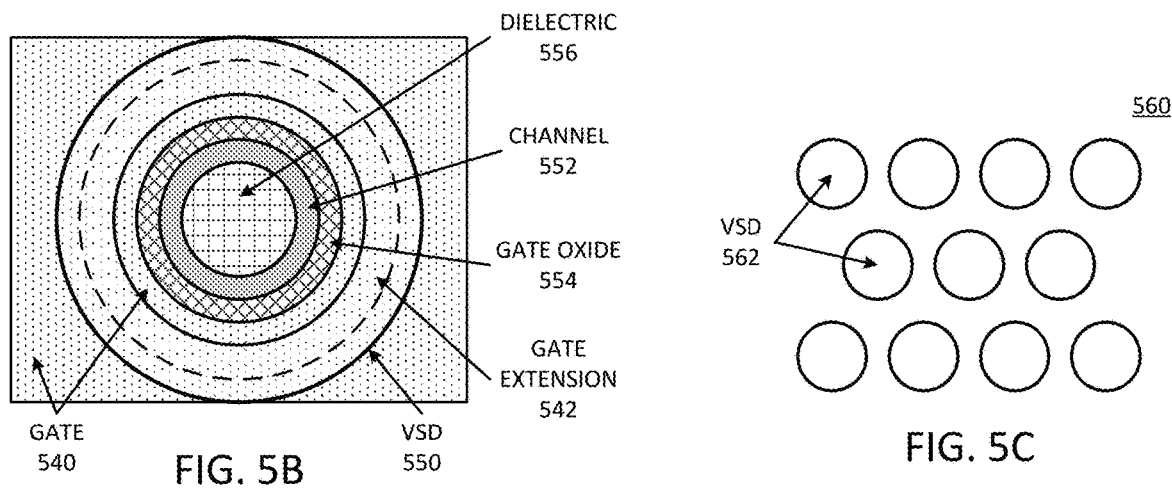
FIG. 5B
FIG. 5C
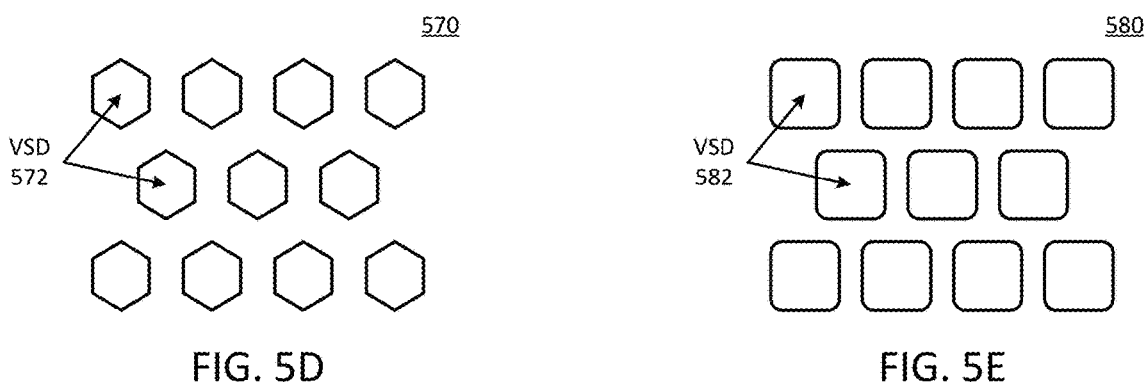
FIG. 5D
FIG. 5E

VERTICAL STRING DRIVER WITH CHANNEL FIELD MANAGEMENT STRUCTURE

FIELD

Descriptions are generally related to three dimensional memory structures, and more particular descriptions are related to a vertical string driver.

BACKGROUND

Three-dimensional (3D) memory devices include stacked, 3D memory arrays that have increased bit density as compared to horizontal memory arrays. A stacked memory array refers to a memory array with a 3D architecture that has bit cells in horizontal directions as well as vertical stacks of layers. The bit density per unit of integrated circuit area is higher in stacked arrays because the cells can be formed around vertical channels instead of only around a horizontal channel. Stacked memory arrays have strings of bits that can be controlled with a string driver.

Even though the memory array is vertically stacked, the traditional string driver for stacked silicon CMOS (complementary metal-oxide semiconductor) devices has a horizontal geometry that is buried under the stacked array. Emerging manufacturing processes are able to shrink the channels and reduce the horizontal layout of the 3D arrays. However, the string drivers with horizontal geometry need an area on the die that restricts the ability to increase the density of the vertical channels. Thus, the restriction of increasing density in the horizontal geometries can limit the developmental roadmap for scaling vertical memory devices to higher densities.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIG. 5A is a representation of an example of a top view of a circuit with vertical string drivers.

FIG. 5B is a representation of an example of a top view of a vertical string driver.

FIG. 5C is a representation of an example of a layout of vertical string drivers with a circular profile.

FIG. 5D is a representation of an example of a layout of vertical string drivers with a hexagonal profile.

FIG. 5E is a representation of an example of a layout of vertical string drivers with a square profile.

Figure 1:
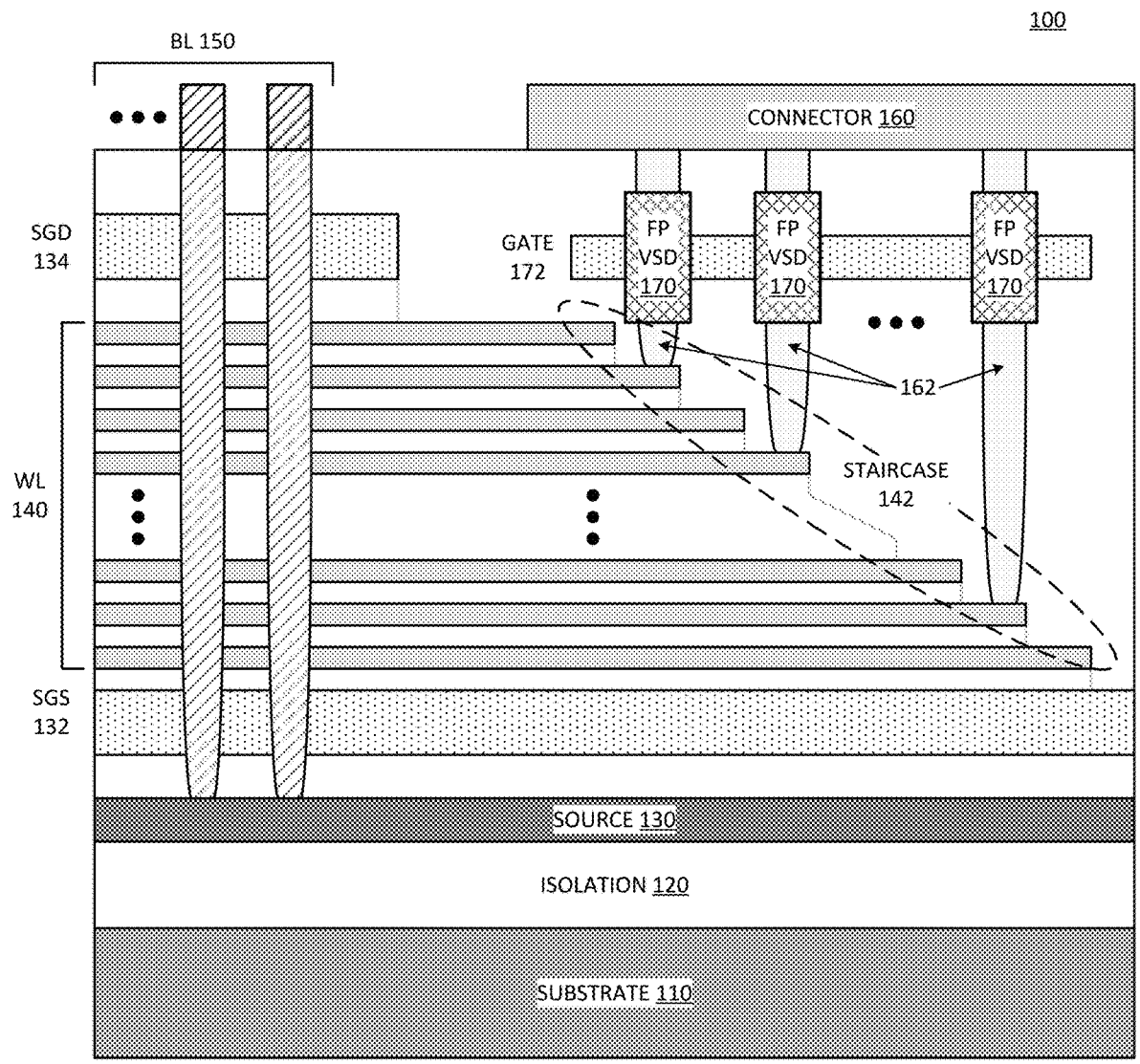
FIG. 1 is a representation of an example of a cross section of a circuit with a stacked memory having a staircase region with vertical string drivers having field management structure.

Descriptions of certain details and implementations follow, including non-limiting descriptions of the figures, which may depict some or all examples, and well as other potential implementations.

DETAILED DESCRIPTION

As described herein, a driver circuit for a three-dimensional (3D) memory device has a gate conductor with a field management structure. In one example, the field management structure can be considered a field plate electrically coupled to a gate conductor. In one example, the field management structure can be considered to make the gate into a gate with a staircase structure. The field management structure causes an electric field peak in a vertical channel of the 3D memory device when a voltage differential exists between the source conductor and the drain conductor and the gate conductor is not biased. The condition when a voltage differential exists between the source conductor and the drain conductor and the gate conductor is not biased can be referred to as the off state of the string driver, where the string driver is holding back a high voltage. The electrical field peak can adjust the electrical response of the driver circuit, enabling the circuit to have a higher breakdown threshold voltage and improved drive current. Thus, the driver circuit can enable a scalable vertical string driver that is above the memory array instead of under the memory array circuitry.

An example of a stacked memory array includes a 3D NAND (memory cells that store a cell with inverted AND gates). String drivers for 3D NAND devices can be required to block a drain-to-source voltage in excess of 20 V, or approximately around 30 V in certain implementations.

Such a high voltage exceeds the structural limit of convention thin film transistors, such as those that would be used for vertical string drivers.

A vertical string driver is expected to hold a high voltage (e.g., dozens of Volts) in the off state of the driver. The high voltage is a blocking voltage that can be applied for programming of selected portions of the memory array. Reference to holding the high voltage refers to being able to have the voltage potential from the drain to source without resulting in a reverse-bias breakdown that can cause a buildup of carriers under the gate oxide, which can result in punching through the gate oxide. It will be understood that reducing the conductivity of the channel and extending the channel length can have a positive impact on the ability to hold a high voltage. However, reducing the conductivity would result in lower on-state current and increase the on-state resistance. The ideal string driver would have little to no on-state resistance.

The tradeoff between high blocking voltage for the off-state and low drain-to-source resistance for the on-state traditionally prevents the use of polysilicon (poly-Si, or simply "poly") as a candidate material for the channel. Other thin film materials in addition to polysilicon could also be candidate materials for the channel. For example, doped metal oxide films could be used. More specifically, zinc oxide (ZnO), cadmium oxide (CdO), indium oxide (InO), or other conductive metal oxides can be used. It will be understood that the ratios of metal atoms to oxygen atoms is not specified in the names, and different oxide compounds could be used that could include different ratios of metal to oxygen atoms. In one example, the metal oxide can be conductive due doping, similar to the doping of semiconductor materials to tune conductivity. Dopants can include aluminum, gallium, indium, or other dopant material to cause the metal oxide to be conductive. Descriptions herein focus on examples with polysilicon for the channel conductor in the vertical channel. The descriptions will be understood to apply to the use of conductive metal oxides for the channel conductor as well as polysilicon. For purposes of simplicity, descriptions may only mention polysilicon, and will be understood to not be so limited.

A field management structure in the vertical string driver (VSD) can eliminate local high electric fields around the gate corner of the thin film transistor. In one example, the field management structure can be referred to as a field plate, which can include additional edges or corners that create additional electric field (e-field) peaks in the channel. The additional peaks can more effectively spread the electric field, which reduces the local e-field around the gate corner.

The reduction of the electric field around the gate interface to the channel can be thought of as similar to a RESURF (reduced surface field) architecture for traditional 2D (two dimensional) transistor design. 2D transistors include a "surface" at the top of the transistor channel. 2D high voltage transistor design can include a RESURF architecture to reduce voltage at the surface of the channel. The architecture of vertical channels and the traditional 2D channels are different, and thus, traditional RESURF architectures would not apply to the vertical channel. However, the field management structure can achieve a similar "RESURF" effect in that the electric field near the gate interface can be reduced.

Thus, the field management structure can allow the adoption of poly-Si as the channel material. The field management structure design can improve the breakdown voltage (BV) by eliminating the local high electric field around the gate corner of the thin film transistor. Thus, the vertical string driver can achieve high blocking voltage in the off state while providing good conduction resistance in the on state. Calibrated simulations suggest improvement of the breakdown voltage by over 3 times relative to a similar design without the field management structure. In addition to the 3× improvement of the BV, the simulated device provided enhanced driver current relative to the same design without the field management structure.

With such field management, a vertical string driver can provide the desired perform parameters, enabling deployment of a VSD above the memory array instead of using horizontal string drivers buried under the memory array. Such a VSD would be scalable with the scaling of the memory array for horizontal feature-size reduction, which saves die area. The periphery circuitry for the memory array can be scaled down instead of limiting the scaling of the memory device chip area.

FIG. 1 is a representation of an example of a cross section of a circuit with a stacked memory having a staircase region with vertical string drivers having field management structure. Circuit 100 represents a cross-section of a portion of a memory device having a staircase region of a nonvolatile (NV) memory. In one example, circuit 100 represents a portion of a 3D NAND memory, such as a 3D NAND flash device. In one example, the vertical string drivers in circuit 100 could be applied to a 3DXP (3D crosspoint) memory or other stacked memory. It will be understood that certain features in circuit 100 are not necessarily drawn to scale. Rather, certain features are emphasized while others are de-emphasized.

Circuit 100 includes substrate 110, which represents a semiconductor surface on which the 3D memory structure is built. In one example, circuit 100 includes an isolation layer, such as isolation 120. Isolation 120 can represent an oxide layer (e.g., silicon dioxide ($SO_2$)) or a nitride layer that provide electrical isolation of the substrate from the electrical conductor of source 130. Source 130 can represent a metal conductor, or a poly-Si material doped to a desired conductivity. Source 130 represents a source conductor for current to flow through the vertical channels of circuit 100.

In one example, circuit 100 includes another isolation layer (not specifically labeled) between source 130 and a select gate. In one example, for a 3D structure, circuit 100 includes a select gate source layer SGS 132, or equivalent. Additionally, circuit 100 can include a select gate drain layer SGD 134 as a drain for the memory layers.

The memory structures are formed in the layers between SGS 132 and SGD 134 in the layers of wordlines (WL) 140. The number of layers of WL 140 can be different for different memory devices. Layers of WL 140 form a 3D stack of bitcells or storage cells. In general, the wordlines are activated in response to a row address for a memory access operation (e.g., read or write).

Circuit 100 includes bitlines (BL) 150 that are charged in response to a column address for the memory access operation. WL 140 connect to multiple rows of bitcells, and BL 150 select individual bits or bitcells of the selected row or rows. The orientation of the stack of WL 140 can vary based on perspective. For example, the wordline at the top of the stack or top layer of the stack can be considered a first wordline near an edge of staircase region 142. In one example, the wordline at the bottom of the stack or bottom layer of the stack can be considered the first wordline in staircase 142.

As illustrated, BL 150 go into the page in circuit 100 and WL 140 go from left to right on the page. BL 150 and WL 140 are orthogonal to each other. In one example, the bitcells are at the intersection of a BL and a WL. In one example, BL 150 has vertical columns or channels through layers of WL 140. In one example, a NV media includes a bitcell at an overlap of a bitline and a wordline.

Staircase 142 illustrates the staircase structure of circuit 100. The staircase structure can be identified as a staircase stack, and refers to the fact that from a cross-section view, using substrate 110 as a reference "floor", a wordline layer above another wordline layer will not extend as far as the one below it. Thus, the wordline layers at the edge appear to have steps up from the wordline closest to substrate 110 to the wordline farthest away from substrate 110.

Staircase 142 represents a region that exposes the various wordlines for vertical connection to connector layer 160. Connector 160 represents a conductive line in a layer that allows electrical access to circuit 100 from external I/O (input/output) for a device in which circuit 100 will be incorporated. In one example, connector 160 represents multiple parallel conductive lines that extend from left to right in the orientation of FIG. 1. The connector lines can be parallel with WLs 140, and orthogonal to BLs 150.

Staircase 142 represents a stepped region of the layers of WL 140, in which the rows extend out further in the lower levels of the stack to make contact with vertical connectors or vertical pillars 162. Vertical pillars 162 connect wordlines to connector 160. Connectors 160 connect the wordlines to external contacts for the memory chip of circuit 100. Connector layer 160 can also be referred to as an access layer or contact, and is located at or near a top layer of circuit 100. Connector 160 provides a connection point for external I/O.

In one example, circuit 100 includes vertical string drivers (VSD) 170. More specifically, the vertical string drivers are illustrated as FP VSD, or field plate VSDs. The field plate refers to a field management structure within VSDs 170. In one example, VSD 170 is triggered by gate 172. Gate 172 represents a gate to control the on state and the off state of VSD 170. In turn, VSD 170 controls the flow of current through connection pillars 162. Control of current flow through pillars 162 controls the charging of WL 140.

FP VSD 170 are located at the top of the pillars that connect to staircase 142. In one example, the location of VSD 170 at the top of the staircase enables scaling down the periphery area. Circuit 100 can represent a NAND device with a vertical string driver for a NAND string. In general, circuit 100 represents a device with a vertical string driver for any technology that applies a polysilicon thin film high voltage device.

Figure 2A:
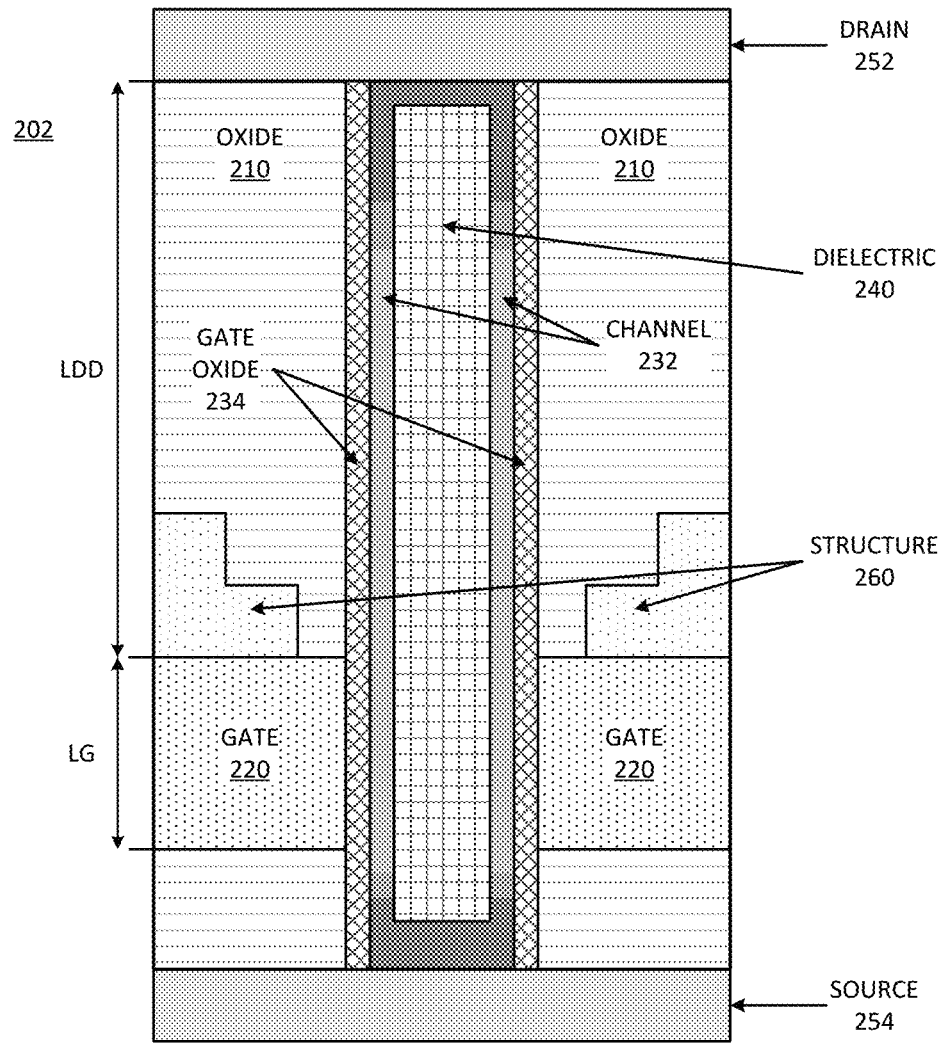
FIG. 2A is a representation of an example of a cross section of a vertical string driver with a field management structure.

FIG. 2A is a representation of an example of a cross section of a vertical string driver with a field management structure. Circuit 202 provides an example of a vertical string driver in accordance with VSD 170 of FIG. 1. Circuit 202 represents a cross section view of the vertical string driver circuit.

In one example, circuit includes gate 220, which is the gate to control conduction of the string driver. The string driver of circuit 202 provides conduction between source 254 and drain 252. In one example, source 254 connects circuit 202 to a vertical pillar. In one example, drain 252 connects circuit 202 to a connector that is to drive the vertical connector.

In one example, circuit 202 includes oxide 210 as an isolation layer between gate 220 and source 254, as well as between gate 220 and drain 252. In one example, circuit 202 can include a nitride as an isolation layer in the alternative to oxide 210. From one perspective, gate 220 is vertically separated from source 254 by an electrical isolation layer, which could be referred to as a first electrical isolation layer. Gate 220 is vertically separated from drain 252 by an electrical isolation layer, which could be referred to as a second electrical isolation layer.

In one example, source 254 is a metal or a highly doped N-type (N+) polysilicon. In one example, drain 252 is a metal or a highly doped N+ polysilicon. N-type polysilicon refers to polysilicon conductor that is doped with a material to cause electrons to be the majority carriers of current when the material conducts current. N-type poly is different from P-type poly, which refers to a material doped with other materials to cause holes to be the majority carriers of current when the material conducts current. In one example, either source 254, or drain 252, or both source 254 and drain 252 include multiple layers, such as a metal and a layer of polysilicon (e.g., highly doped N+ material). It will be understood that metal is a material that inherently has electron-dominant carriers.

A highly doped material (N+ for N-type material, and P+ for P-type material) refers to a poly material that has a relatively high percentage of dopant to result in a relatively high number of carriers. A low doped material (N− for N-type material, and P− for P-type material) refers to a poly material that has a relatively low percentage of dopant to result in a relatively low number of carriers. It will be understood that "highly doped" and "low doped" are relative terms that will be different for different implementations. The amount of doping that results in high doping or low doping can depend on the amount of current that will be conducted, as well as the desired resistance. In general, the terms make reference to the fact that certain materials have different doping levels relative to each other in the same circuit.

In one example, channel 232 is a highly doped N+ poly channel. In one example, drain 252 and source 254 are either metal or a higher doped poly than channel 232. Thus, at the junction of channel 232 with drain 252 and at the junction of channel 232 with source 254, the channel can have higher doping due to diffusion of carriers from the drain and source, respectively. Such an implementation is illustrated in circuit 202 by the darker shading of channel 232 at the junction regions. The junction regions are where channel 232 is electrically connected to drain 252 and source 254.

In one example, channel 232 is a "hollow channel," with doped polysilicon as a conductive channel, surrounding dielectric 240. In one example, dielectric 240 is oxide, which could be the same oxide as oxide 210. Channel 232 is represented in an idealized state, with straight channel walls and symmetric size from drain 252 to source 254. In a practical implementation, it will be understood that channel 232 may have tapering, having a wider width near drain 252 than the width near source 254.

In one example, channel 232 includes gate oxide 234. Gate oxide 234 may also be the same material as oxide 210 and dielectric 240. Whether or not gate oxide 234, oxide 210, and dielectric 240 are the same material, they are represented with different shading to represent the fact that they are created at different steps of processing of circuit 202.

In one example, gate 220 is a polysilicon material. In one example, gate 220 is a high doped P+ poly gate. It will be understood that the concentration of dopant for N+ material is not necessarily the same as the concentration of dopant for P+ material, although it may be. Structure 260 represents a field management structure electrically coupled to gate 220. In one example, structure 260 is structurally part of gate 220. Typically, if gate 220 is a p-type material, structure 260 will also be a p-type material. In one example, structure 260 is lighter doped (e.g., P−) than gate 220 (e.g., P+).

Circuit 202 illustrates gate 220 having a height (or a vertical length) of LG, which is the length of the gate. Oxide 210 between gate 220 and drain 252 has a vertical length of LDD, or the length of the drain region. LDD can be considered the drain regions or the length of the drift region or drift space for channel 232. The drift region refers to the length of channel 232 between gate 220 and drain 252, which allows the accumulation of charge to allow circuit 202 to operate in high voltage conditions or to withstand a high voltage differential between source 254 and drain 252.

Structure 260 provides a physical structure to affect the electrical field or electric field in the polysilicon of channel 232. More specifically, structure 260 can trigger an electrical field peak in vertical channel 232 when the gate conductor of gate 220 is not biased. Gate 220 is not biased when the string driver is in the off state, where no bias voltage or bias current is applied to gate 220. In one example, structure 260 provides at least one additional step to gate 220. The addition of at least one step with structure 260 can provide at least two corners for electric field distribution around gate 220. In one example, structure 260 includes at least two steps or two corners, to provide at least three corners for electric field distribution around gate 220. The steps refer to a number of layers with variations in how far across oxide 210 each step extends. The layer closer to gate 220 extends across more of oxide 210 than the layer above it. The layer above it refers to a layer that is closer to drain 252. Such a pattern would continue for however many steps structure 260 includes.

Structure 260 can be referred to as a field plate, field plate conductor, or a field management structure. In one example, the combination of structure 260 and gate 220 can be considered a staircase-gate or an extended gate. Structure 260 extends the conductivity of gate 220 into oxide 210 toward drain 252. The extension of structure 260 into oxide 210 will cause a distribution of the electric field in channel 232 when the string driver is in an off state. The off state can be considered the state when a voltage differential exists between source 254 and drain 252 and gate 220 is not charged with a bias current. It will be understood that regardless of LG, or the length of gate 220, the corners of gate 220 will cause a high electric field when there is a high voltage differential between drain 252 and source 254. Thus, even making the layer of material for gate 220 thicker would not remove the high voltage field at the corners.

Structure 260 can distribute the electric field along more length of channel 232, reducing the field strength at the corners of gate 220. In one example, every step of structure 260 can cause an additional electric field peak in channel 232. The addition of more electric field peaks will cause a distribution of the accumulated charge in channel 232, reducing the overall strength of any single field. The distribution of the electric field by structure 260 results in a significantly higher breakdown voltage relative to a comparable circuit that has only gate 220.

It will be understood that the cross section view of circuit 202 shows a rectangular cross section for channel 232. The channel can be cylindrical or other shape, as described in more detail below. Reference to the shape of the channel can refer to a shape of the channel itself or of a top view of the channel. Whatever the shape of channel 232, structure 260 can provide a field-plated vertical gate all around the thin film transistor that is used as a string driver. The thin film transistor refers to the transistor formed by the thin films of gate oxide 234 and the conductor of channel 232, to create the channel between drain 252 and source 254 to be selectively driven by application of a bias current or bias voltage on gate 220.

In accordance with what is described above, circuit 202 can have a similar effect to a RESURF effect for a horizontal, planar transistor. The additional e-field or e-fields created by structure 260 can operate to deplete the drift region. Depletion of the drift region reduces the electric field on the thin poly film of channel 232. In effect, the spreading of the electric field can extend the depletion region in the reverse bias application, which can increase the breakdown voltage.

Channel 232 can be referred to as a vertical channel. Channel 232 intersects the conductor of gate 220. Channel 232 can be designed to be orthogonal to gate 220 or approximately orthogonal, allowing for processing variance. It can be observed that structure 260 rises into oxide 210 in a manner parallel to channel 232 and to gate oxide 234 which separates the conductor of channel 232 from the conductor of gate 220.

Figure 2B:
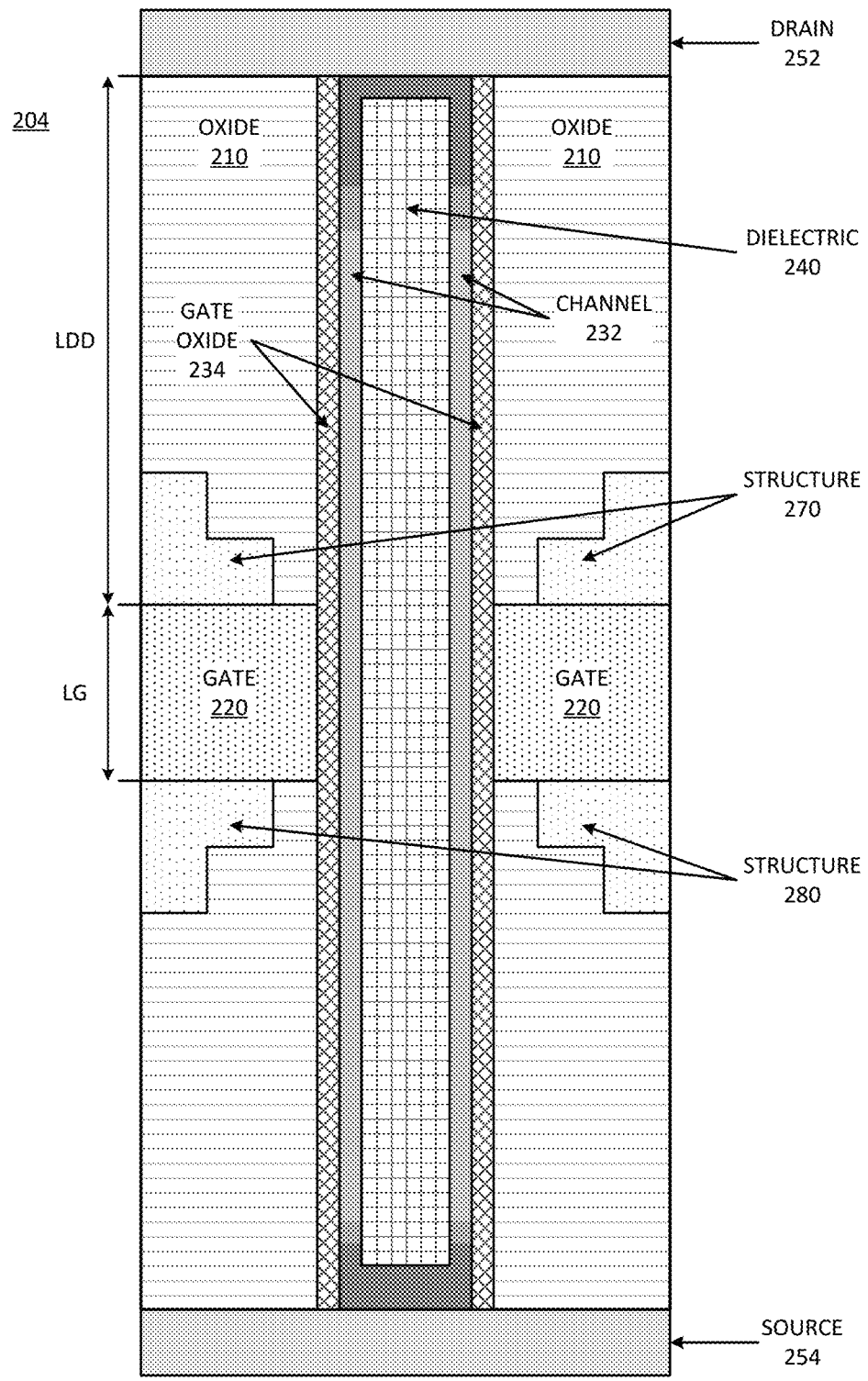
FIG. 2B is a representation of an example of a cross section of a vertical string driver with symmetrical field management structures.

FIG. 2B is a representation of an example of a cross section of a vertical string driver with symmetrical field management structures. Circuit 204 provides an example of a vertical string driver in accordance with VSD 170 of FIG. 1. Circuit 204 represents a cross section view of the vertical string driver circuit. Circuit 204 can be an example of a vertical string driver in accordance with circuit 202 of FIG. 2A.

The description of circuit 202 above applies to circuit 204 for all elements having the same reference numeral. Structure 270 provides an example of structure 260, and the descriptions of structure 260 above apply to structure 270 in circuit 204.

In addition to structure 270 to extend gate 220, in one example, circuit 204 includes structure 280. Whereas structure 270 extends into the electrical isolation of oxide 210 between gate 220 and drain 252, structure 280 extends into the electrical isolation of oxide 210 between gate 220 and source 254. It could be said that structure 280 extends into a first electrical isolation layer and structure 270 extends into a second electrical isolation layer. The orientation of "first" and "second" could be reversed.

In one example, the descriptions of structure 260 of FIG. 2A apply to structure 280, with the exception of the orientation of the structure. Structure 280 can provide the same functionality as structure 270 or structure 260. The additional of structure 280 can provide further e-field peaks in channel 232, and thus further distribute the electrical field in the channel for the off state. The use of structure 280 and structure 270 can be referred to as a symmetrical configuration.

Structure 270 is illustrated as having two steps, to provide two additional corners. Structure 280 is likewise illustrated as having two steps, to provide an additional two corners. In one example, structure 270 and structure 280 are mirror images of each other around gate 220. In one example, structure 280 is not necessarily the same as structure 270. For example, structure 270 could have more steps than structure 280. In one example, both structure 270 and structure 280 have one step. In one example, structure 280 has one step and structure 270 has multiple (e.g., 2 or more) steps. Reference to a symmetrical configuration implies that structure 280 is made to be the same as structure 270. However, symmetrical configuration could simply refer to the use of extensions of gate 220 below (i.e., closer to source 254) and above (i.e., closer to drain 252), whether or not the specific structures used to extend the gate have the same physical structure.

In one example, circuit 204 can be considered to have two field plate structures: a first field plate structure that extends into the first electrical isolation layer, and a second field plate structure that extends into the second electrical isolation layer. Structure 270 as a first field plate and structure 280 as a second field plate have a physical structure to trigger electrical peaks in channel 232. Just as structure 270 can be said to be a block or a staircase that steps away from channel 232 and away from gate 220 into the gate oxide 210 toward drain 252, structure 280 can be said to be a block or a staircase that steps away from channel 232 and away from gate 220 into the gate oxide 210 toward source 254.

Figure 3:
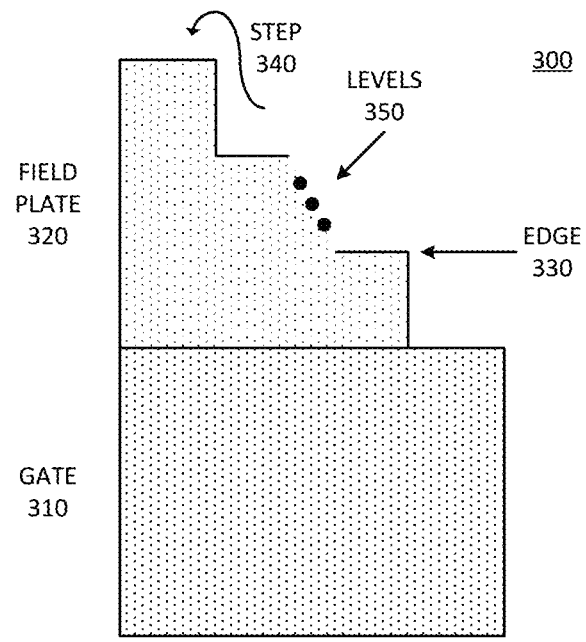
FIG. 3 is a representation of an example of a cross section of a staircase gate for a vertical string driver.

FIG. 3 is a representation of an example of a cross section of a staircase gate for a vertical string driver. Extended gate 300 provides an example of a gate with a field management structure in accordance with an example of circuit 100, circuit 202, or circuit 204.

Extended gate 300 includes gate conductor represented as gate 310. In one example, extended gate 300 includes field plate 320. It will be understood that extended gate 300 only specifically illustrates one field management structure, but another field management structure on the other side of gate 310 could also be added that will have a similar description as that of field plate 320.

Field plate 320 can include 1 or more steps 340. Step 340 refers to how many edges field plate includes in its physical structure. It will be understood that field plate 320 will not extend all the way to the gate oxide of the channel (not specifically shown in FIG. 3, but could be such as gate oxide 234) as gate 310 does. Rather, field plate 320 specifically will have a gap between its closest edge to the gate oxide of the channel to create another corner or another edge 330. Corner or edge 330 refers to a physical structure that provides another corner that will create a field peak in the channel conductor.

Levels 350 represents the fact that each step could be considered a different level of field plate 320. In general, there will be as many levels 350 in field plate 320 as there are steps 340. Each level or step will create another corner or edge 330. There can be a single level in field plate, or two, three, or more levels. Each successive level 350 or successive step will need to start further away from the channel conductor to provide another edge 330 to trigger another e-field peak.

In one example, gate 310 is p-type doped polysilicon. In one example, field plate 320 is also p-type doped polysilicon. Typically, gate 310 has a higher doping than field plate 320. In one example, each step 340 or each level 350 has a lower concentration of dopant or a lower doping density than the previous layer. In one example, all layers of field plate 320 have the same doping level. In general, gate 310 could be said to be P+ doped, and field plate 320 is P-doped.

Figure 4:
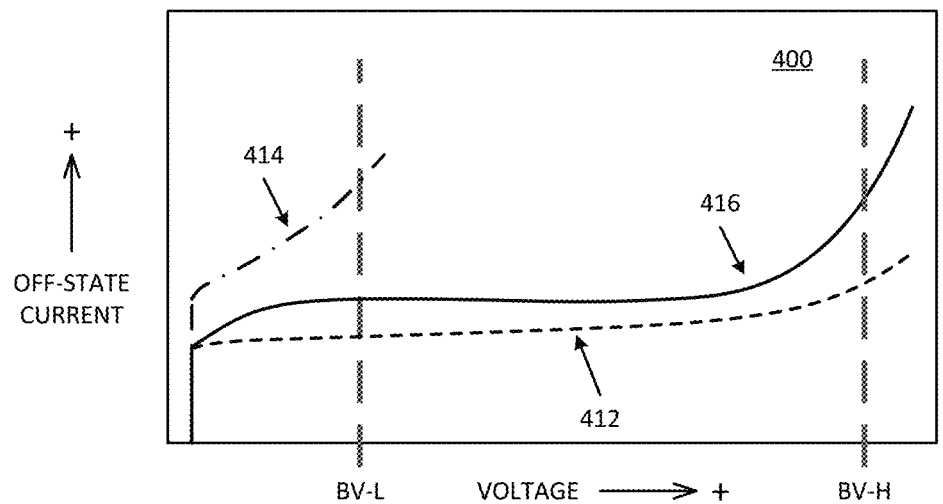
FIG. 4 is a diagrammatic representation of an example of the current response in the off-state of a vertical string driver with a staircase gate.

FIG. 4 is a diagrammatic representation of an example of the current response of a vertical string driver with a staircase gate. Diagram 400 illustrates three curves mapped as off-state current versus voltage differential between drain and source. Voltage increases in the direction of the arrow pointing to the '+' sign. Off-state current increase in the direction of the arrow pointing to the '+' sign.

The specific values of current and voltage are not illustrated in diagram 400, which simply provides the general form of curves for different simulated scenarios as described in more detail below. In one example, the current is plotted on a logarithmic axis rather than a linear axis. The general form of the curves illustrates the improvement provided by the field management structures.

Curve 412 is a dashed line, and represents a current response of a traditional horizontal string driver. The thick dashed line labeled "BV-H" represents a high voltage breakdown voltage, which could, for example, be in excess of 20 V. It can be observed that curve 412 has a breakdown voltage in at the dashed line of BV-H.

Curve 414 is a dashed-dotted line, and represents a current response of a traditional vertical string driver with a poly channel. It can be observed that the breakdown voltage for curve 414 is BV-L, which represents a low breakdown voltage. For example, BV-H could be three or four times higher than BV-L.

Curve 416 is the solid line, an represents a current response for a vertical string driver with a poly channel having a gate with a field management structure. It can be observed that the breakdown voltage for curve 416 may be a little bit lower than BV-H, but is still significantly higher than BV-L. Thus, the field management structure provides a significant improvement in the BV for the vertical string driver, and gives the vertical string driver a similar performance as a traditional horizontal string driver. Calibrated simulation has demonstrated a 3× improvement in BV between a vertical string driver with a field management structure and a vertical string driver without one.

FIG. 5A is a representation of an example of a top view of a circuit with vertical string drivers. Diagram 500 illustrates a top view of an example of a circuit in accordance with circuit 100 of FIG. 1. Diagram 500 can be considered layout of circuit features for the staircase region of a memory device, in an implementation of vertical string drivers for a memory device.

The top view illustrates the orientation of the different portions of the circuit. In diagram 500, bitlines 510 run up and down in the orientation of the figure. Contacts 530 run right to left, orthogonal to bitlines 510. The wordlines are not specifically shown, but would be parallel to contacts 530, and could run under them. Contacts 530 can represent connectors that connect to active wordlines. Additionally, the gates to control the VSDs are not specifically illustrated in diagram 500, but would also run under contacts 530 to intersect with FP VSDs 522.

Rather than specifically showing the wordlines, diagram 500 illustrates staircase 520 with different shading to represent different levels of the staircase region. In diagram 500, the channels of the vertical string drivers are represented as solid circles on the contact conductive lines, while the dashed circles represent the vertical string drivers themselves. FP VSD 522 represents the field plate vertical string drivers, or VSDs with field plate structures as field management structures.

FIG. 5B is a representation of an example of a top view of a vertical string driver. VSD 550 represents a vertical string driver in a cylindrical architecture of the VSD. Gate 540 represents a gate such as gate 172 of FIG. 1. Gate 540 will be understood to pass under the other layers illustrated.

VSD 550 includes gate extension 542, which is a field management structure in accordance with any description herein. In one example, a symmetric field management structure could be located under gate 540, and not visible in VSD 550. Specific steps of gate extension are not specifically shown, but the dashed line through gate 540 can represent that there are multiple layers to gate extension 542. It will be observed that gate extension 542 does not extend all the way to gate oxide 554 of the channel, and thus, there is a small area of gate 540 illustrated to show the gap between the field management structure and the channel.

Gate oxide 554 represents a gate oxide for the operation of the transistor of VSD 550. Channel 552 represents the channel conductor. Dielectric 556 represents the dielectric that is surrounded by channel 552.

FIG. 5C is a representation of an example of a layout of vertical string drivers with a cylindrical profile. Diagram 560 illustrates an example of an offset pattern of VSDs 562 with cylindrical profiles. There could be VSDs lined up in rows and columns, instead of having rows of offset columns as illustrated. It will be understood that the pattern of diagram 560 provides a denser pattern of string drivers. It will be observed that as the processing of vertical channels scales down (for vertical channels not illustrated), the same process scaling could scale down the VSDs.

FIG. 5D is a representation of an example of a layout of vertical string drivers with a hexagonal profile. Diagram 570 illustrates an example of an offset pattern of VSDs 572 with hexagonal profiles. Diagram 570 represents an alternative to the cylindrical profiles illustrated in diagram 560. The patterning options described with respect to diagram 560 apply to diagram 570.

FIG. 5E is a representation of an example of a layout of vertical string drivers with a square profile. Diagram 580 illustrates an example of an offset pattern of VSDs 582 with square profiles. Diagram 580 represents an alternative to the cylindrical profiles illustrated in diagram 560 or the hexagonal profiles of diagram 570. The patterning options described with respect to diagram 560 apply to diagram 580.

FIGS. 6A-6L are diagrammatic representations of a cross-section of stages of processing of a vertical string driver with a field management structure. For purposes of example, FIGS. 6A-6L illustrate the processing to create a vertical string driver with a field management structure. The circuit states illustrated in FIGS. 6A-6L can apply to any example of a vertical string driver with a field management structure to extend the top of the gate, referring to a surface of the gate closest to the drain, such as circuit 202. As illustrated, vertical stacking can refer to any processing that extends circuit elements out or up and away from the semiconductor substrate on which the devices are processed.

Figure 6B:
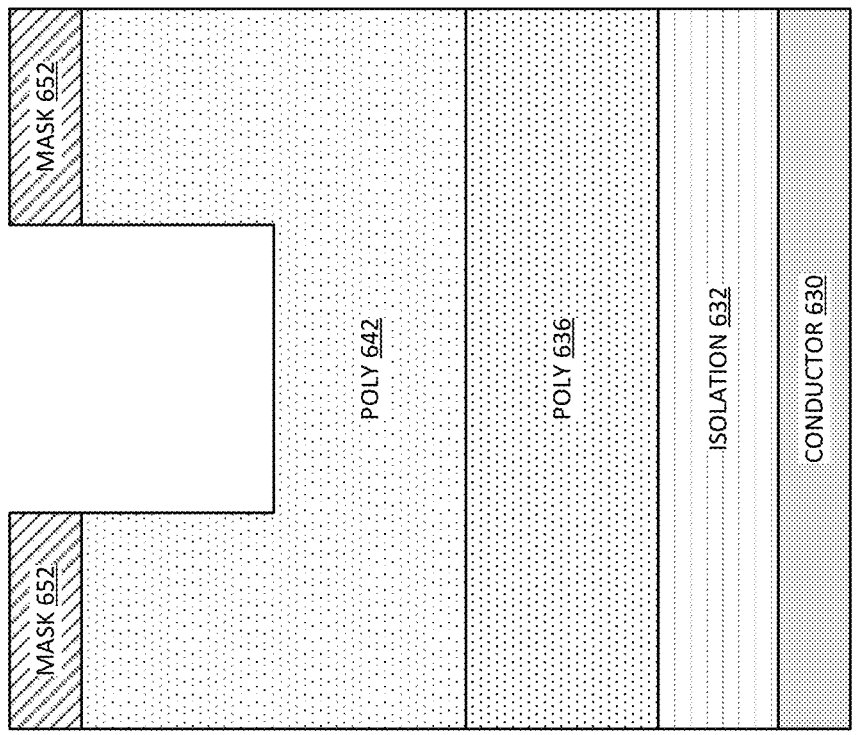
FIGS. 6A-6L are diagrammatic representations of a cross-section of stages of processing of a vertical string driver with a field management structure.
Figure 6A:
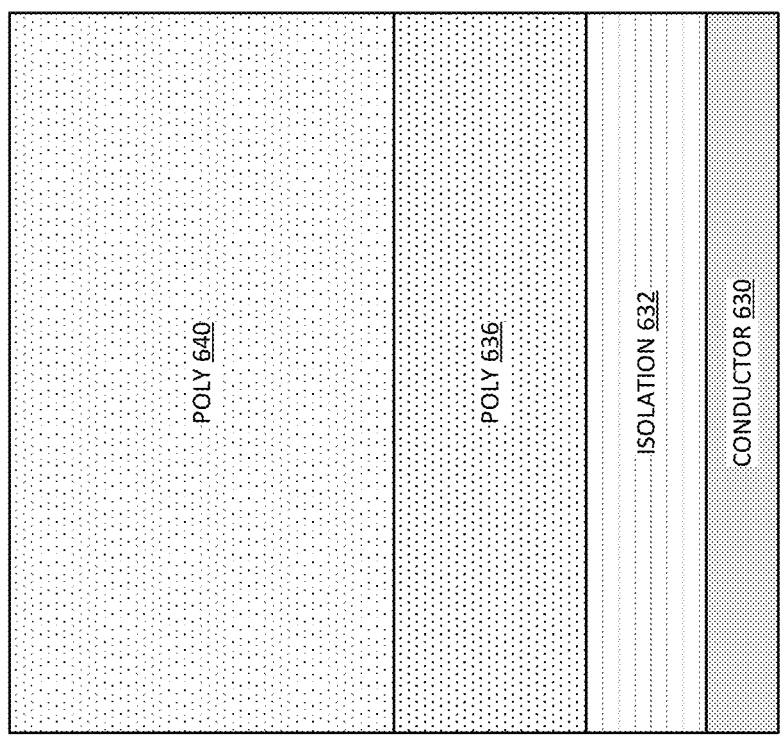

FIG. 6A illustrates circuit state 600, in which conductor 630 is processed on a semiconductor substrate (e.g., a silicon wafer). The semiconductor substrate is not specifically illustrated. Conductor 630 can be a metal or a highly doped polysilicon (e.g., N+ doped poly), or a combination of metal and poly. For example, a metal layer can be deposited, followed by a poly silicon that will provide advantages to creation of other layers or provide a stop layer for etching, or some other processing improvement.

Isolation 632 provides a separation between the conductor 630 and the doped poly material of poly 636. Poly 636 represents a poly material for a select gate that can be used to activate the operation of the vertical string driver. In one example, poly 636 is a P+ doped poly. In one example, poly 640 is processed on poly 636. Poly 636 is for the gate, and poly 640 can be used for a gate extension or field management structure on gate poly 636. In one example, poly 640 is not doped as heavily as poly 640 (e.g., P− doped poly).

FIG. 6B illustrates circuit state 602, in which the processing etches or removes a portion of poly 640. The resulting etched poly layer is represented as poly 642. Mask 652 represents a lithographic mask, such as a photoresist layer. Mask 652 represents a patterned material that can shield areas not to be removed, and expose areas to be removed.

Figure 6D:
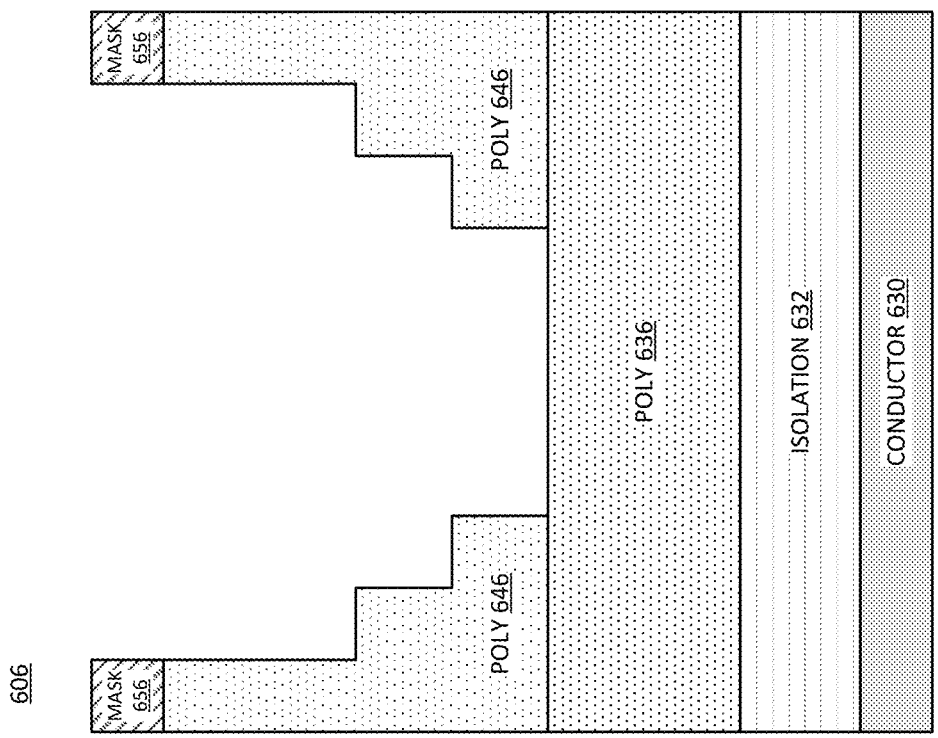
Figure 6C:
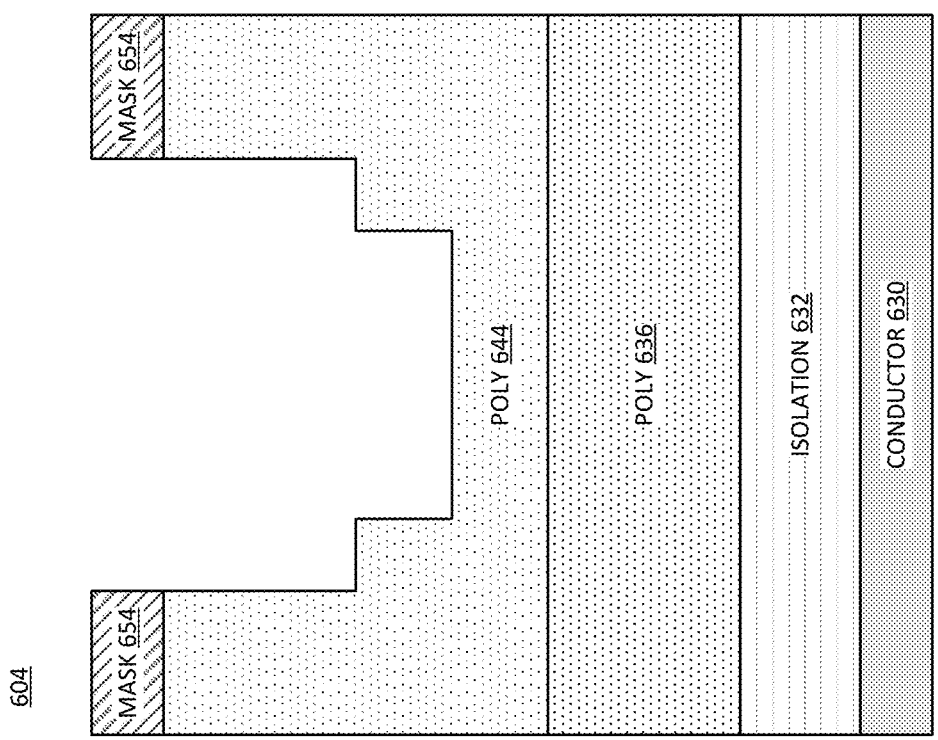

FIG. 6C illustrates circuit state 604, in which the processing removes more material from the top poly, which is illustrated as poly 644. Poly 644 has a stepped region created by applying a different mask 654. Mask 654 exposes more of the poly for removal.

FIG. 6D illustrates circuit state 606, in which the processing removes more material from the top poly, which is illustrated as poly 646. Mask 656 exposes more of the poly to remove more poly to create another step in the poly structure. In one example, the removal of the poly exposes poly 636.

Figure 6E:
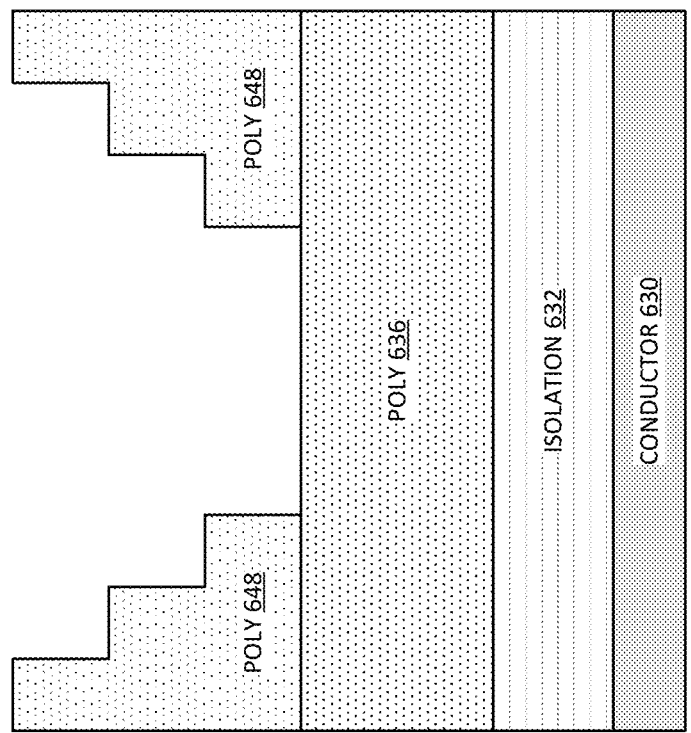

FIG. 6E illustrates circuit state 608, in which the processing can remove the last of the mask and remove more of the poly. The resulting structure of the poly is represented as poly 648, which can be the final state of the poly for the example of the processing illustrated.

Figure 6F:
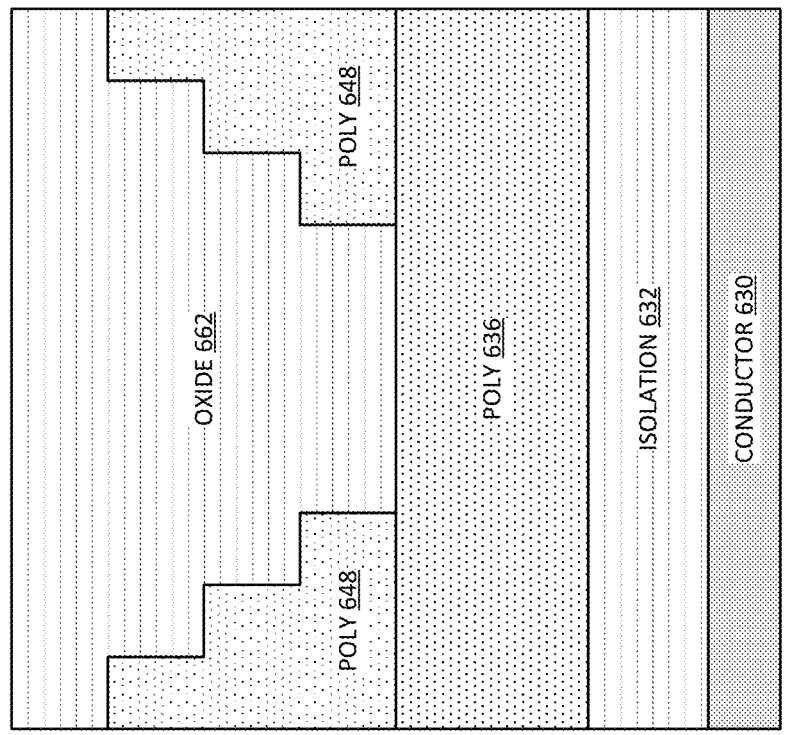

FIG. 6F illustrates circuit state 610, in which the processing creates oxide 662 over poly 636 and poly 638. In one example, isolation 632 and oxide 662 are the same material. In one example, instead of oxide, the processing can apply nitride for either isolation layer or for both isolation layers.

Figure 6H:
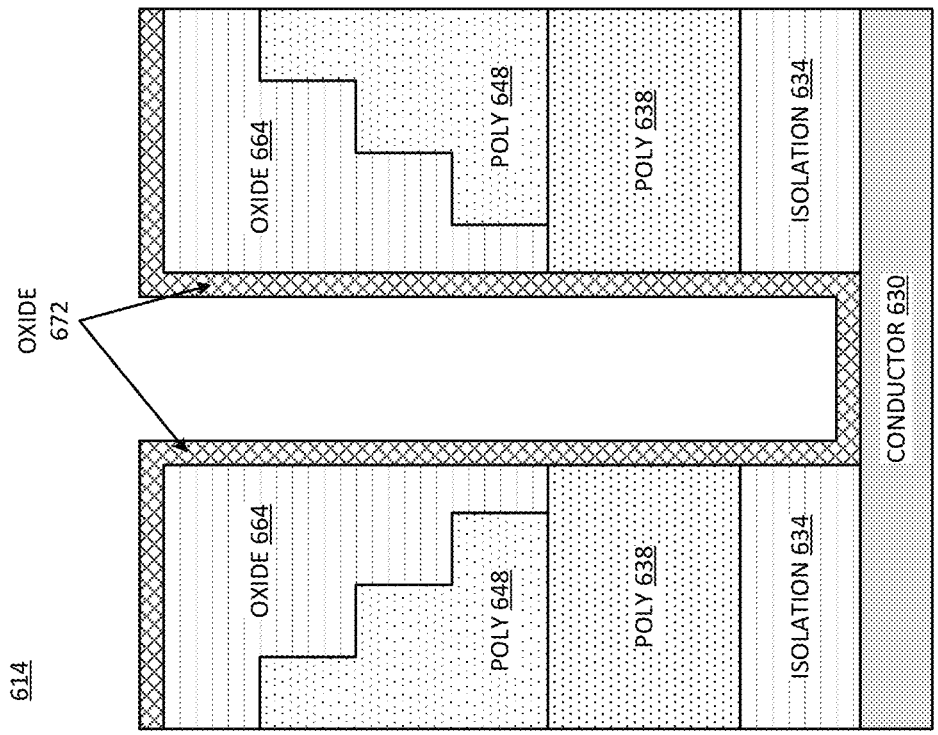
Figure 6G:
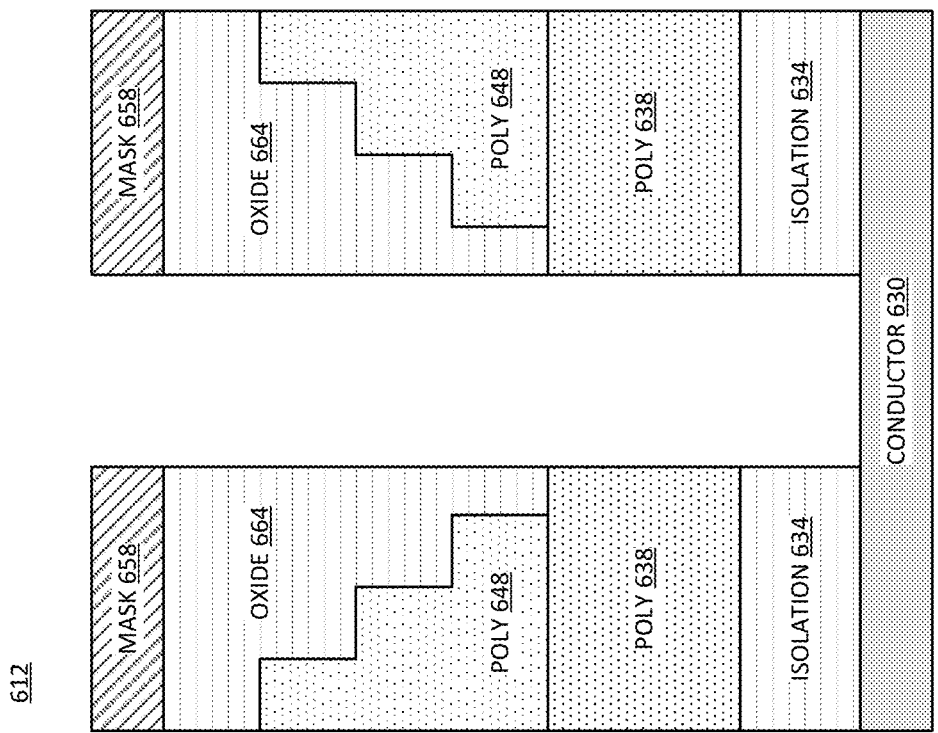

FIG. 6G illustrates circuit state 612, in which the processing applies mask 658 to etch a gap for the channel. The channel will be the vertical channel for the vertical string driver transistor. The new structure of the top layer of oxide is represented as oxide 664. The new structure of the first isolation layer on top of conductor 630 is represented as isolation 634. The new structure of the gate poly is represented as poly 638.

FIG. 6H illustrates circuit state 614, in which the processing can remove the mask and apply oxide 672 as a gate oxide. In one example, oxide 672 covers the top of the circuit as well as the side walls of the channel pillar, and the exposed portion of conductor 630.

Figure 6J:
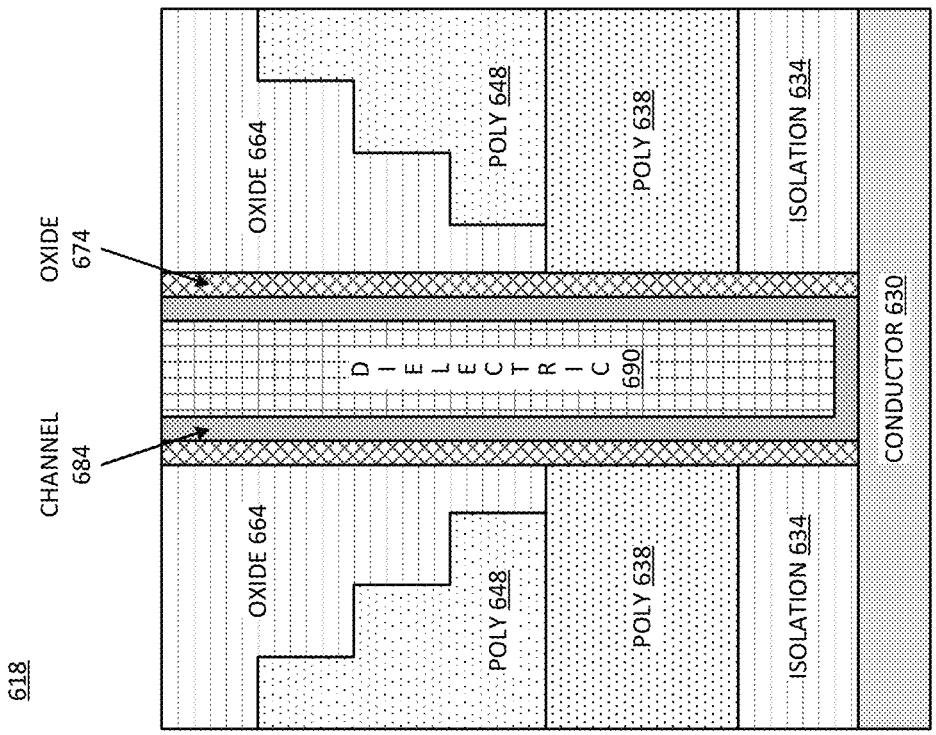
Figure 6I:
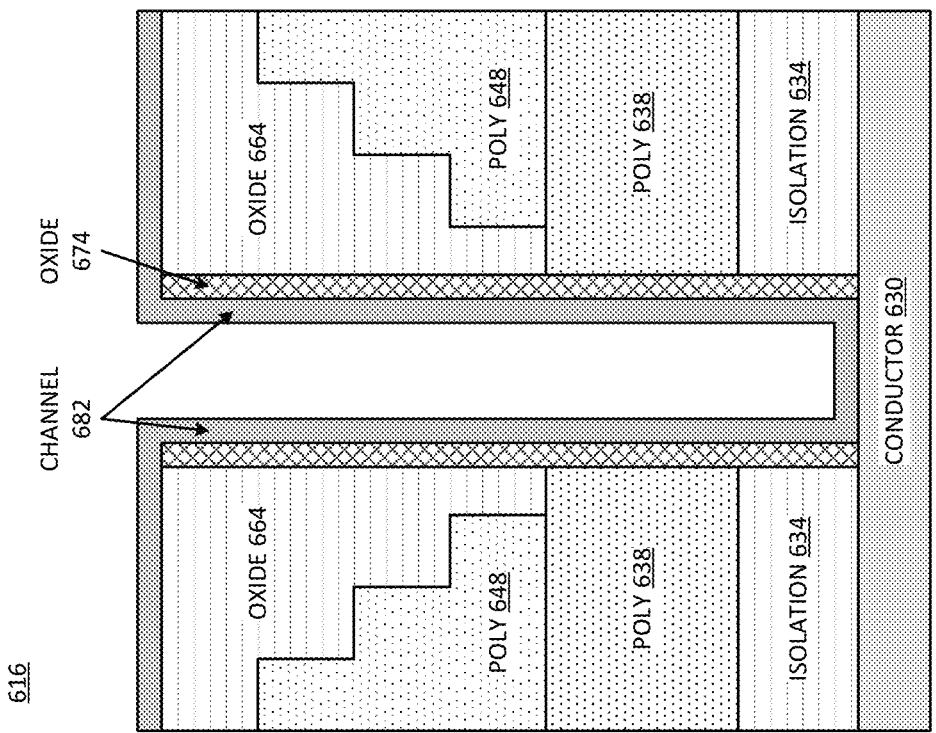

FIG. 6I illustrates circuit state 616, in which the processing can remove the top portion of the gate oxide, from the top of the circuit and from the exposed portion of conductor 630. The processing leaves the side wall of the oxide for the gate oxide. The new structure of the gate oxide is represented as oxide 674. In one example, the processing creates channel conductor material, such as a doped polysilicon material (e.g., N+ doped poly). The channel conductor is represented as channel 682, which covers the top of the circuit as well as the side walls of the channel pillar, and the exposed portion of conductor 630.

FIG. 6J illustrates circuit state 618, in which the processing can remove the top portion of the channel conductor from the top of the circuit. In one example, the channel conductor is not removed from the exposed portion of conductor 630. The processing leaves the side wall of the channel conductor, where the new structure of the channel conductor is represented as channel 684. In one example, the processing creates dielectric 690 in the channel pillar. In one example, dielectric 690 is an oxide material.

Figure 6L:
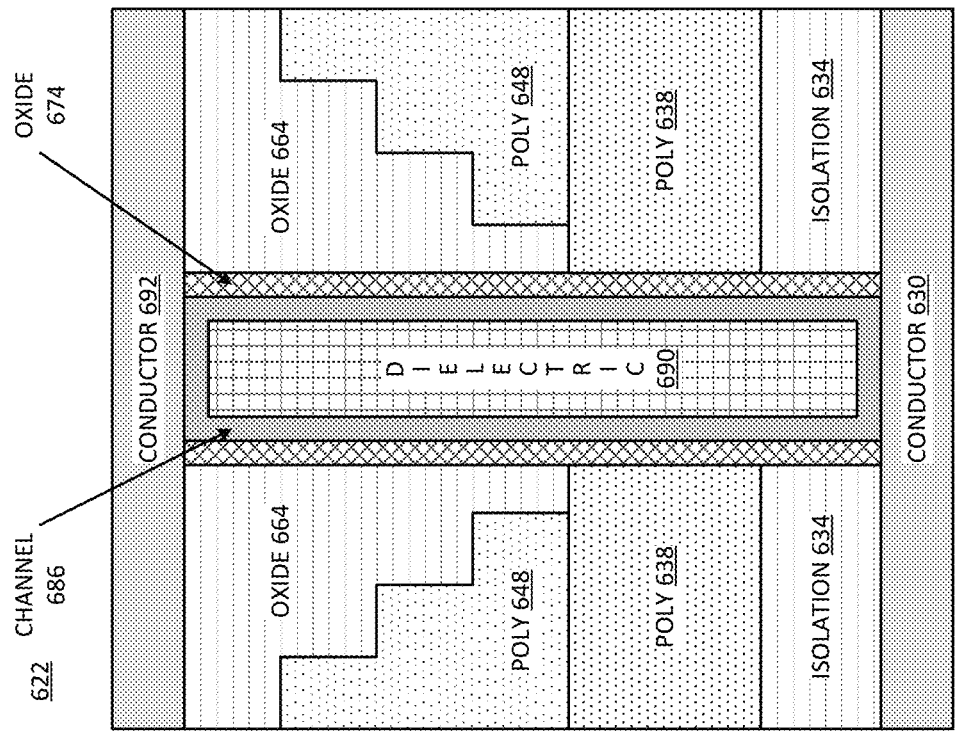
Figure 6K:
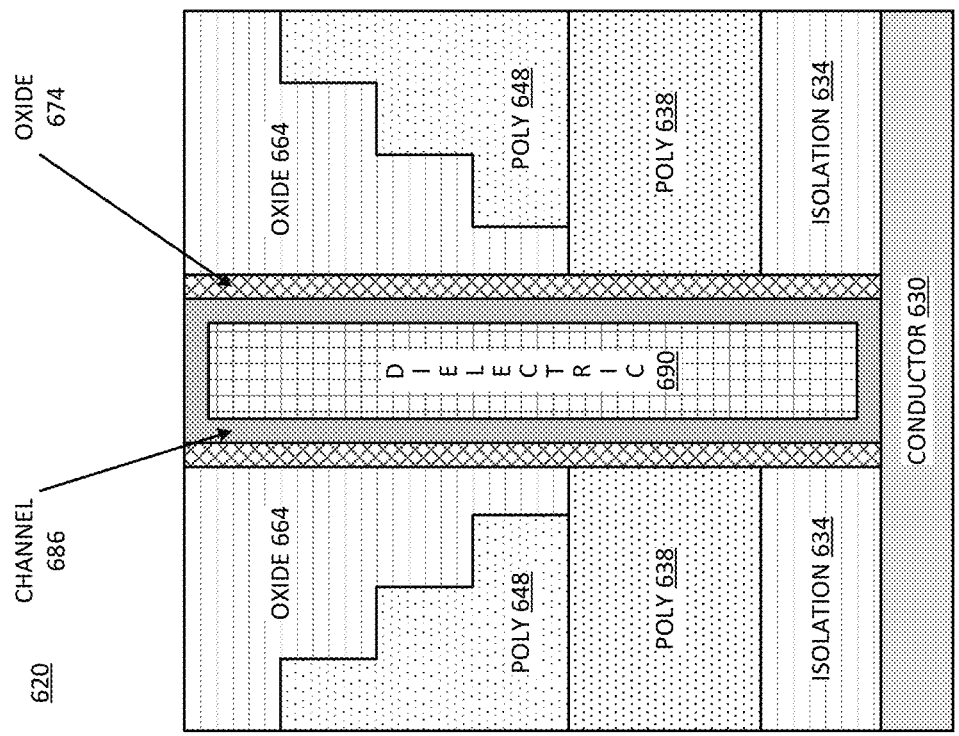

FIG. 6K illustrates circuit state 620, in which the processing can cap the channel by removing some of dielectric 690 can creating more channel conductor over the dielectric. Thus, in one example, the channel conductor completely surrounds dielectric 690. The new structure of the channel conductor is represented as channel 686.

FIG. 6L illustrates circuit state 622, in which the processing can create conductor 692 over the top of the circuit, including over oxide 664 and over channel 686. In one example, some of conductor 692 and some of conductor 630 diffuse into channel 686. Conductor 692 can be a metal or a highly doped polysilicon (e.g., N+ doped poly), or a combination of metal and poly.

FIGS. 7A-7F are diagrammatic representations of a cross-section of stages of processing of a vertical string driver with symmetrical field management structures. For purposes of example, FIGS. 7A-7F illustrate the processing to create the symmetric portion of a field management structure for a vertical string driver. In one example, the processing states of FIGS. 7A-7F can be applied prior to certain processing of FIGS. 6A-6L. More specifically, the processing states of FIGS. 7A-7F can be applied prior to creation of the gate poly and the gate extension poly of FIG. 6A. Further processing states can be appropriately modified to etch through the resulting structure to create a vertical string driver. The resulting string driver can include symmetrical field management structures, such as with circuit 204.

Figures 7A, 7B:
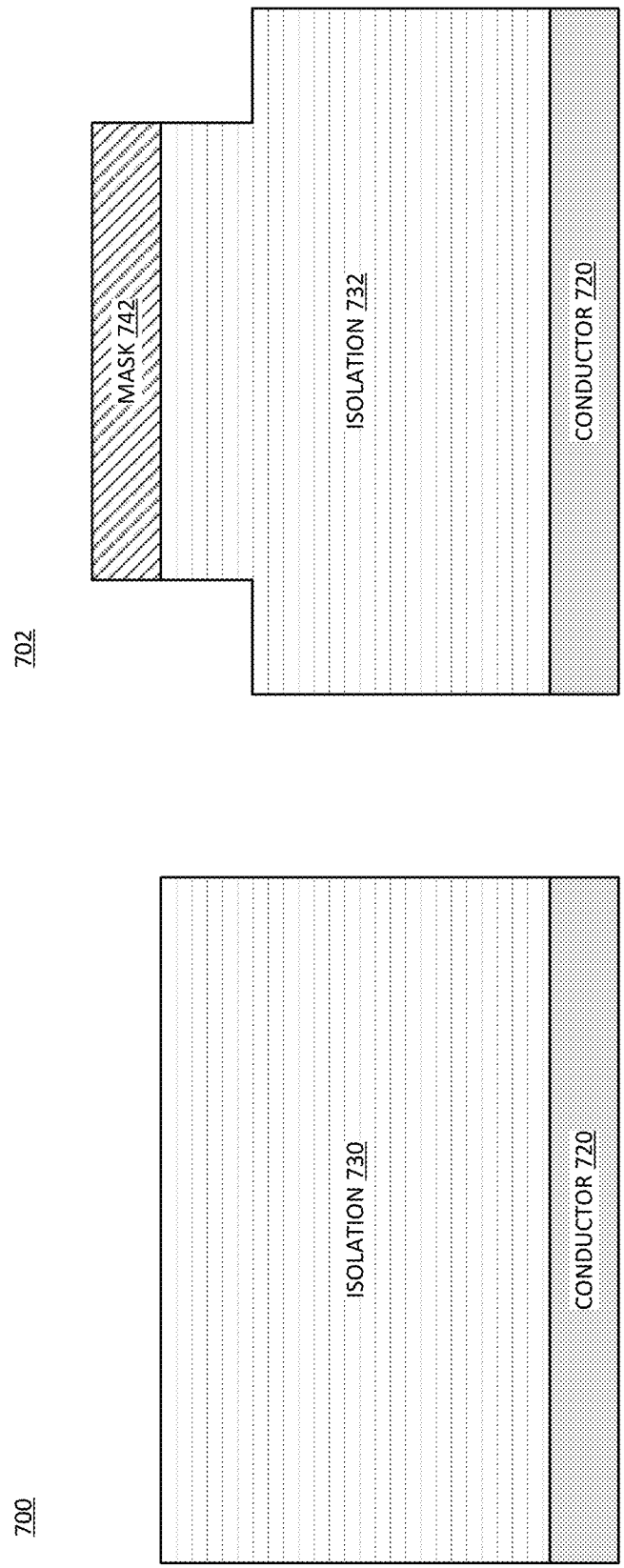
FIGS. 7A-7F are diagrammatic representations of a cross-section of stages of processing of a vertical string driver with symmetrical field management structures.

FIG. 7A illustrates circuit state 700, in which conductor 720 is processed on a semiconductor substrate (e.g., a silicon wafer). The semiconductor substrate is not specifically illustrated. Conductor 720 can be a metal or a highly doped polysilicon (e.g., N+ doped poly), or a combination of metal and poly. For example, a metal layer can be deposited, followed by a poly silicon that will provide advantages to creation of other layers or provide a stop layer for etching, or some other processing improvement. Isolation 730 provides a separation between the conductor 720 and a doped poly material for a gate selector.

FIG. 7B illustrates circuit state 702, in which the processing etches or removes a portion of the isolation layer. The resulting etched isolation layer is represented as isolation 732. Mask 742 represents a lithographic mask, such as a photoresist layer. Mask 742 represents a patterned material that can shield areas not to be removed, and expose areas to be removed.

Figure 7D:
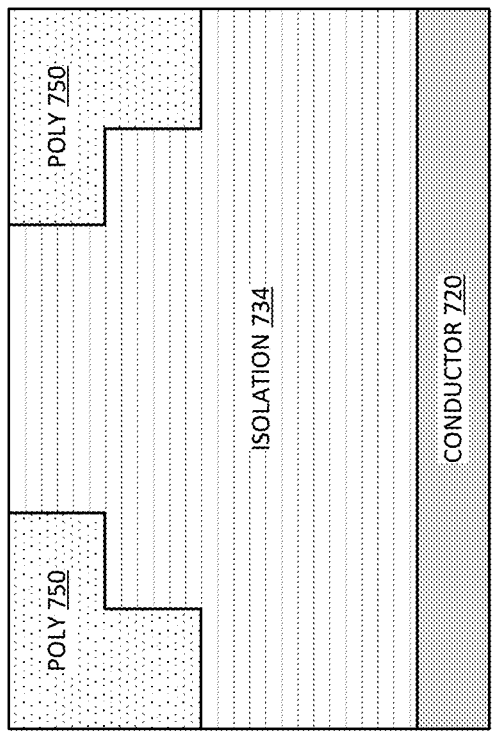
Figure 7C:
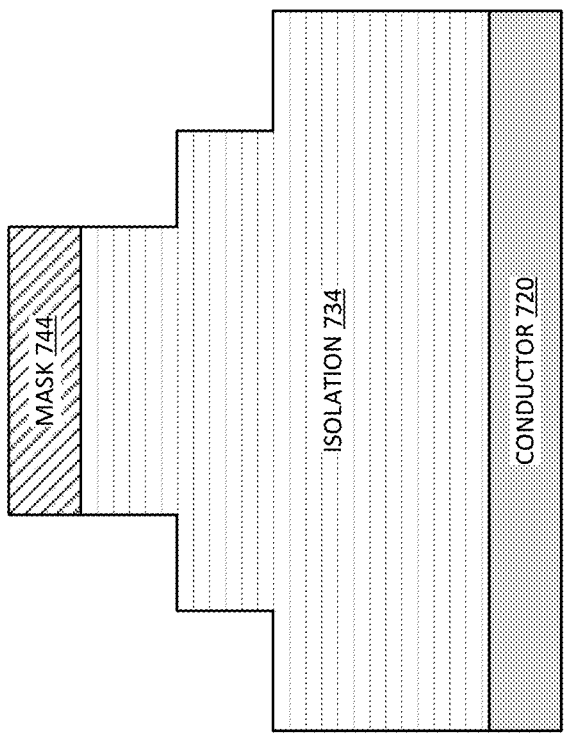

FIG. 7C illustrates circuit state 704, in which the processing removes more material from the isolation layer, for which the resulting structure is illustrated as isolation 734. Isolation 734 has a stepped region created by applying a different mask 744. Mask 744 exposes more of the isolation layer for removal.

FIG. 7D illustrates circuit state 706, in which the processing creates poly 750 in the staircase region of isolation layer 734. In the example processing, the field management structure represented by poly 750 only has two levels or two steps, rather than the three layers illustrated in the previous processing sequence. It will be understood that the application of additional sequences of mask and removal of the isolation material could create additional steps for poly 750.

Figure 7F:
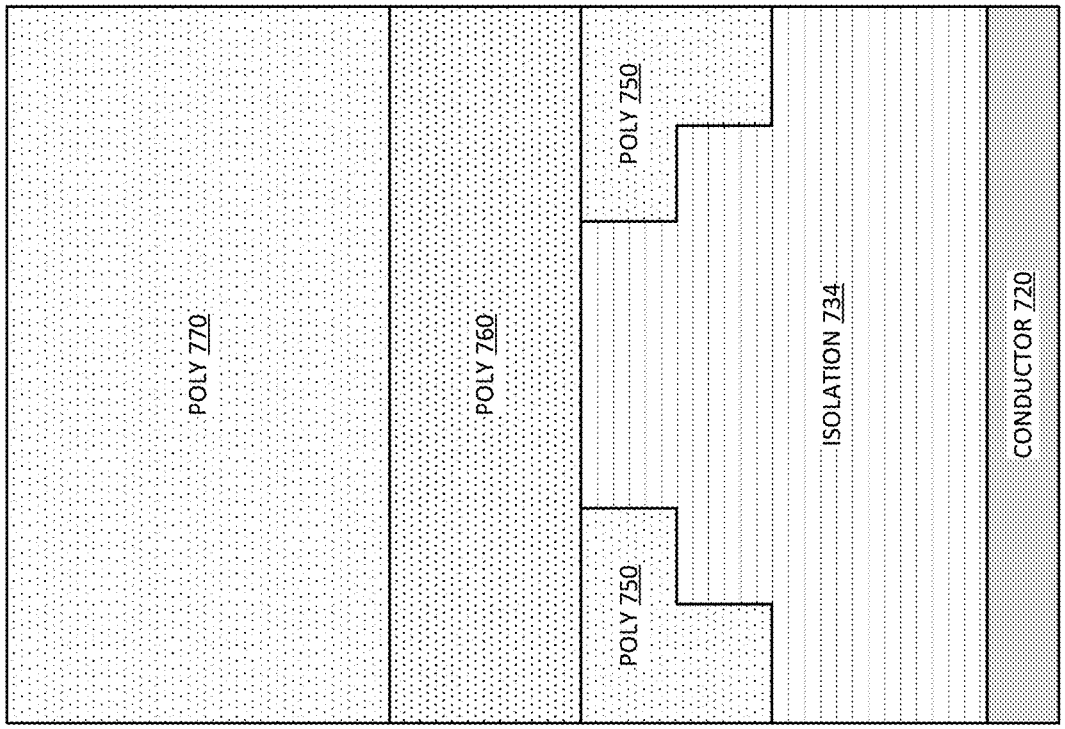
Figure 7E:
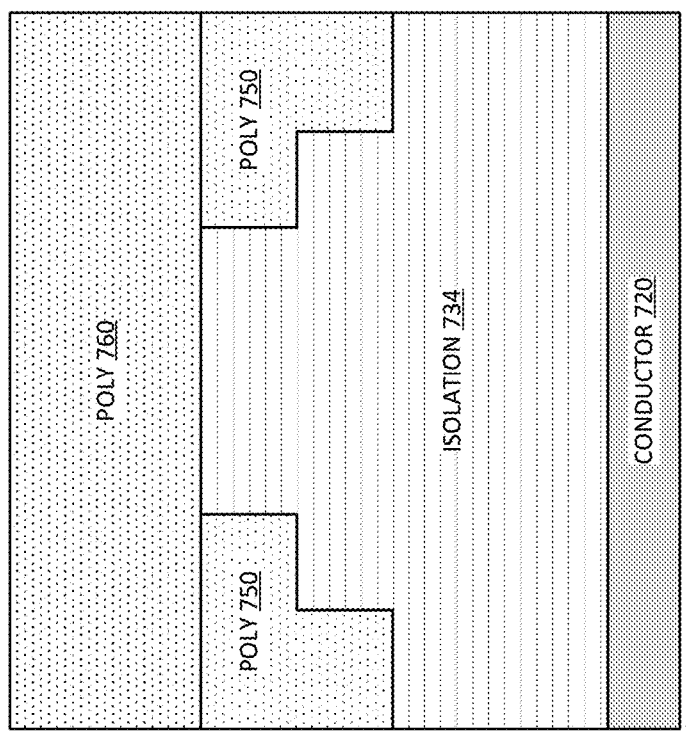

FIG. 7E illustrates circuit state 708, in which the processing can create poly 760 on top of poly 750 and the portion of isolation 734 that is not filled with poly 750. Poly 760 represents a poly material for a select gate that can be used to activate the operation of the vertical string driver. In one example, poly 760 is a P+ doped poly. In one example, poly 750 is not doped as heavily as poly 760 (e.g., P− doped poly).

FIG. 7F illustrates circuit state 710, in which the processing creates poly 770 over poly 760. In one example, circuit state 710 can be the starting point for the processing illustrated in circuit state 602 of FIG. 6B.

Figure 8A:
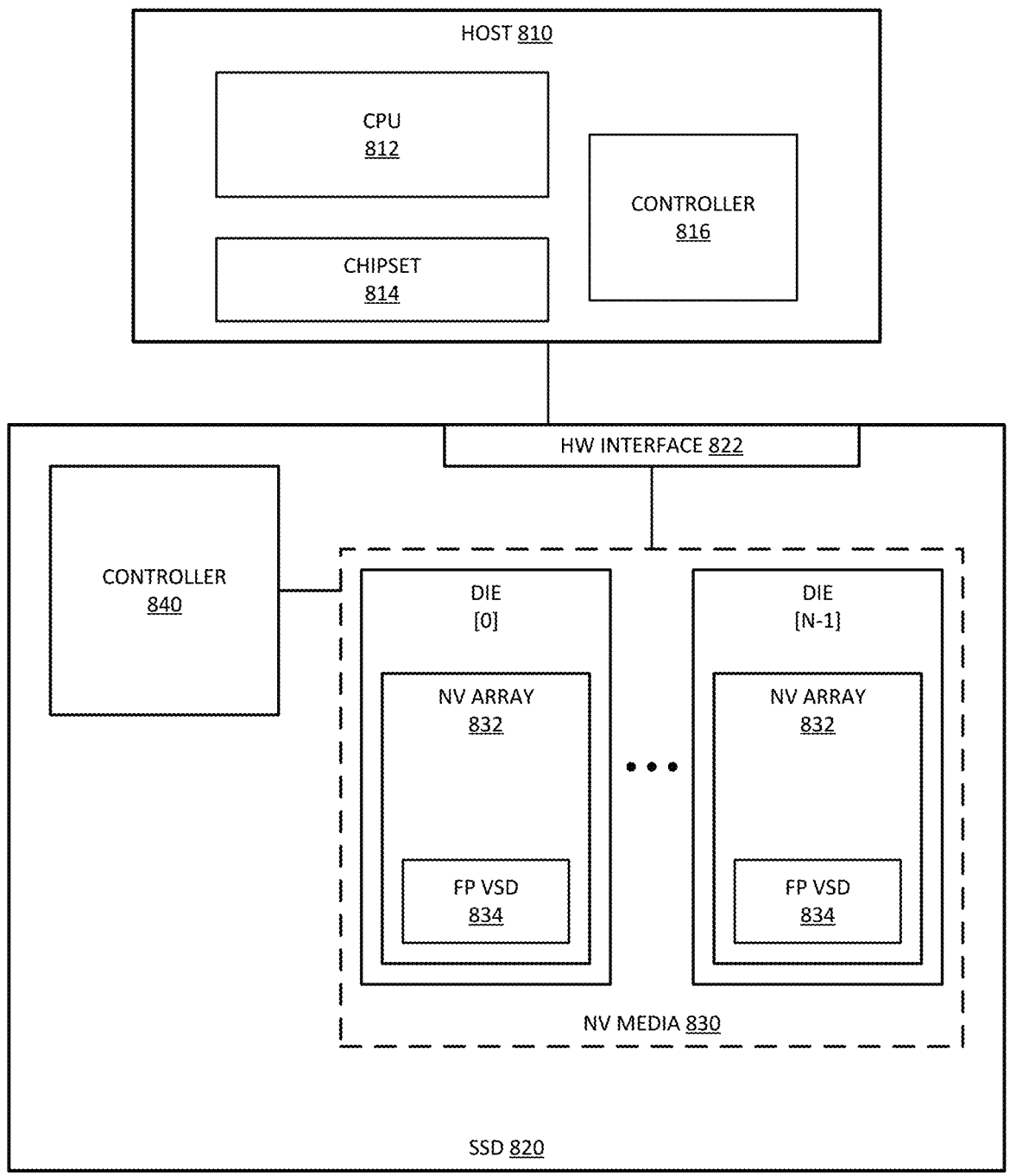
FIG. 8A is a block diagram of an example of a system with a hardware view of a solid state drive (SSD) with a nonvolatile array having vertical string drivers with field management structures.

FIG. 8A is a block diagram of an example of a system with a hardware view of a solid state drive (SSD) with a nonvolatile array having vertical string drivers with field management structures. System 802 represents components of a nonvolatile storage system that could implement nonvolatile media having a staircase structure with vertical string driver having field management structures in accordance with any example described, such as circuit 100, circuit 202, or circuit 204.

System 802 includes SSD 820 coupled with host 810. Host 810 represents a host hardware platform that connects to SSD 820. Host 810 includes CPU (central processing unit) 812 or other processor as a host processor or host processor device. CPU 812 represents any host processor that generates requests to access data stored on SSD 820, either to read the data or to write data to the storage. Such a processor can include a single or multicore processor, a primary processor for a computing device, a graphics processor, a peripheral processor, or a supplemental or auxiliary processor, or a combination. CPU 812 can execute a host OS and other applications to cause the operation of system 802.

Host 810 includes chipset 814, which represents hardware components that can be included in connecting between CPU 812 and SSD 820. For example, chipset 814 can include interconnect circuits and logic to enable access to SSD 820. Thus, host platform 810 can include a hardware platform drive interconnect to couple SSD 820 to host 810. Host 810 includes hardware to interconnect to the SSD. Likewise, SSD 820 includes corresponding hardware to interconnect to host 810.

Host 810 includes controller 816, which represents a storage controller or memory controller on the host side to control access to SSD 820. In one example, controller 816 is included in chipset 814. In one example, controller 816 is included in CPU 812. Controller 816 can be referred to as an NV memory controller to enable host 810 to schedule and organize commands to SSD 820 to read and write data.

SSD 820 represents a solid-state drive or other storage system or module that includes nonvolatile (NV) media 830 to store data. SSD 820 includes HW (hardware) interface 822, which represents hardware components to interface with host 810. For example, HW interface 822 can interface with one or more buses to implement a high speed interface standard such as NVMe (nonvolatile memory express) or PCIe (peripheral component interconnect express).

In one example, SSD 820 includes NV (nonvolatile) media 830 as the primary storage for SSD 820. In one example, NV media 830 is or includes a block addressable memory technology, such as NAND (not AND) or NOR (not OR). In one example, NV media 830 can include a nonvolatile, byte addressable media that stores data based on a resistive state of the memory cell, or a phase of the memory cell. For example, NV media 830 can be or include a three dimensional crosspoint (3DXP) memory or a storage array based on chalcogenide phase change material (e.g., chalcogenide glass). In one example, the NV media can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

In one example, NV media 830 is implemented as multiple dies, illustrated as N dies, Die[0:{N−1}]. N can be any number of devices, and is often a binary number. SSD 820 includes controller 840 to control access to NV media 830. Controller 840 represents hardware and control logic within SSD 820 to execute control over the media. Controller 840 is internal to the nonvolatile storage device or module, and is separate from controller 816 of host 810.

The NV dies of NV media 830 include 3D NV array 832, which is a three-dimensional array of storage cells based on the NV media. NV array 832 includes a staircase structure with vertical string drivers in accordance with any example herein. FP VSD 834 represents field plate vertical string drivers, which represent vertical string drivers with field management structures. FP VSD 834 can be a string driver circuit to control current from a connector trace to an exposed connection of a wordline in the staircase region of the 3D NV array 832.

Figure 8B:
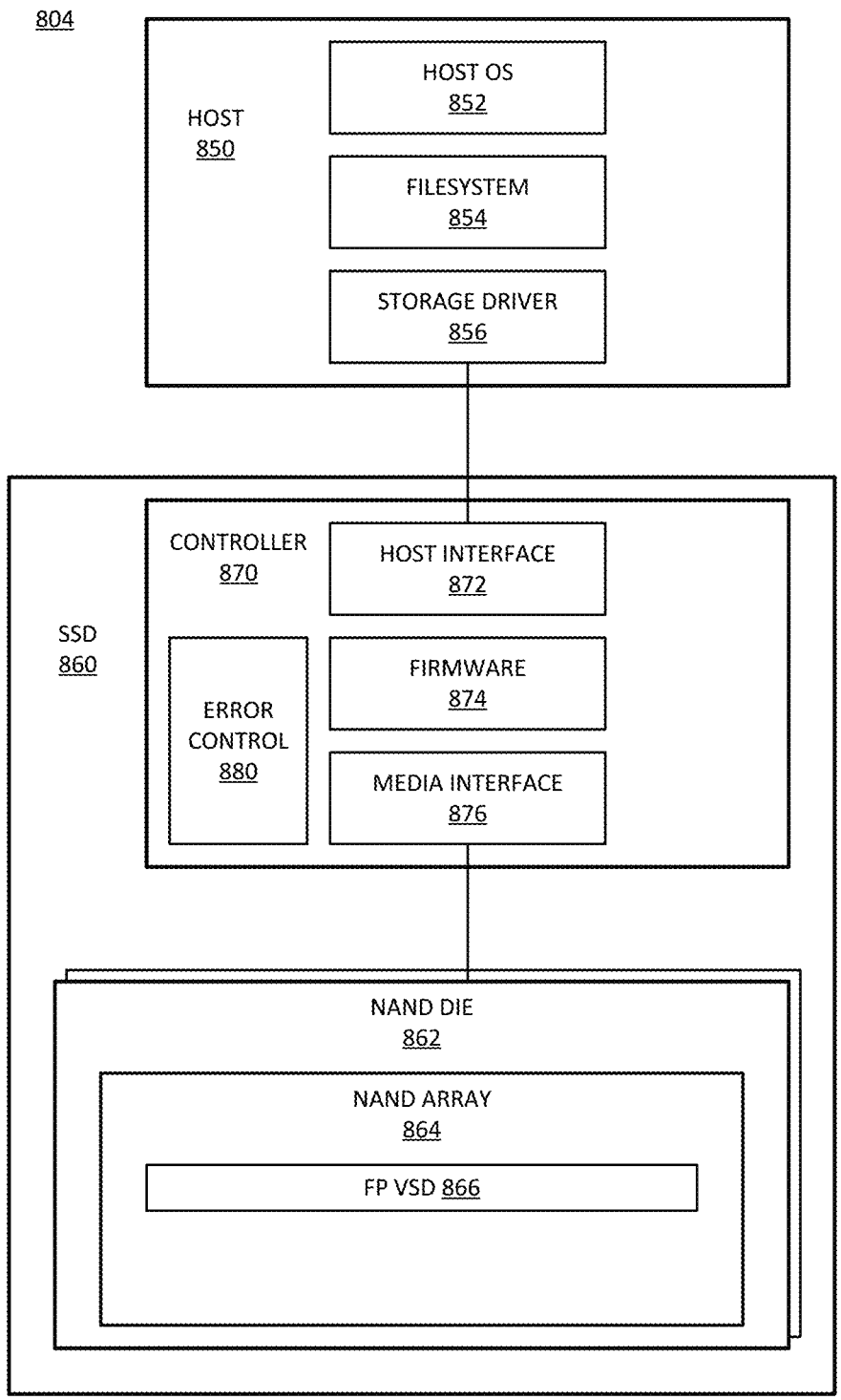
FIG. 8B is a block diagram of an example of a logical view of system with a solid state drive (SSD) with a nonvolatile array having vertical string drivers with field management structures.

FIG. 8B is a block diagram of an example of a logical view of system with a solid state drive (SSD) with a nonvolatile array having vertical string drivers with field management structures. System 804 provides one example of a system in accordance with system 802 of FIG. 8A.

System 804 illustrates the logical layers of the host and SSD of a hardware platform in accordance with system 802. System 804 can represent software and firmware components of an example of system 802, as well as physical components. In one example, host 850 provides one example of host 810. In one example, SSD 860 provides one example of SSD 820.

In one example, host 850 includes host OS 852, which represents a host operating system or software platform for the host. Host OS 852 can include a platform on which applications, services, agents, and/or other software executes, and is executed by a processor. Filesystem 854 represents control logic for controlling access to the NV media. Filesystem 854 can manage what addresses or memory locations are used to store what data. There are numerous filesystems known, and filesystem 854 can implement known filesystems or other proprietary systems. In one example, filesystem 854 is part of host OS 852.

Storage driver 856 represents one or more system-level modules that control the hardware of host 850. In one example, drivers 856 include a software application to control the interface to SSD 860, and thus control the hardware of SSD 860. Storage driver 856 can provide a communication interface between the host and the SSD.

Controller 870 of SSD 860 includes firmware 874, which represents control software/firmware for the controller. In one example, controller 870 includes host interface 872, which represents an interface to host 850. In one example, controller 870 includes media interface 876, which represents an interface to NAND die 862. NAND die 862 represents a specific example of NV media, and includes an associated 3D NAND array 864. NAND array 864 includes a staircase structure with vertical string drivers in accordance with any example herein. FP VSD 866 represents field plate vertical string drivers, which represent vertical string drivers with field management structures. FP VSD 866 can be a string driver circuit to control current from a connector trace to an exposed connection of a wordline in the staircase region of the 3D NAND array 864.

Media interface 876 represent control that is executed on hardware of controller 870. It will be understood that controller 870 includes hardware to interface with host 850, which can be considered to be controlled by host interface software/firmware 874. Likewise, it will be understood that controller 870 includes hardware to interface with NAND die 862. In one example, code for host interface 872 can be part of firmware 874. In one example, code for media interface 876 can be part of firmware 874.

In one example, controller 870 includes error control 880 to handle data errors in accessed data, and corner cases in terms of compliance with signaling and communication interfacing. Error control 880 can include implementations in hardware or firmware, or a combination of hardware and software.

Figure 9:
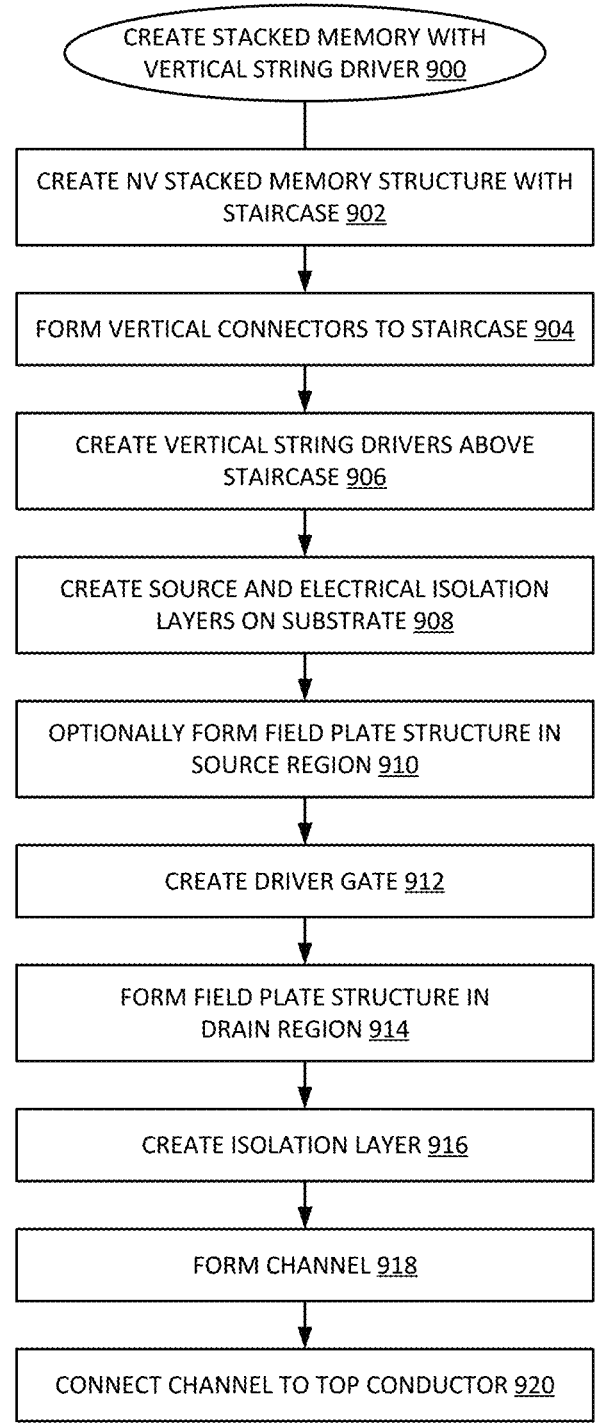
FIG. 9 is a flow diagram of an example of a process for creating a vertical string driver with field management structure.

FIG. 9 is a flow diagram of an example of a process for creating a vertical string driver with field management structure. Process 900 illustrates an example of a process to create a stacked memory or other 3D device with a vertical string driver.

In one example, the processing creates a nonvolatile stacked memory structure with a staircase region, at 902. In one example, the processing forms vertical connectors to the staircase, at 904. The vertical connectors allow selection of strings of circuit elements, such as bit cells.

In one example, the processing creates vertical string drivers to control the selection of the vertical connectors, at 906. The creation of the vertical string drivers can include creation of a source and electrical isolation layers on a substrate, at 908. The electrical isolation layer on the source can be referred to as a first isolation layer. In one example, the processing optionally forms a field plate structure in the source region in the electrical isolation layer on top of the source conductor, at 910.

The processing creates a driver gate layer, at 912. The processing forms a field plate structure in the drain region, at 914. The field plate structure can be in accordance with any field plate structure described. In one example, the processing creates an electrical isolation layer over the field plate and gate, at 916. The isolation layer on the gate and below the drain conductor can be referred to as a second isolation layer.

In one example, the processing forms a vertical channel with a thin film doped polysilicon channel conductor, at 918. The processing creates the channel through the isolation layer on the gate, through the gate conductor, and through the isolation layer on the source. The vertical channel includes an oxide to electrically isolate the channel conductor from the gate conductor. The field plate or field plates provide a physical structure to trigger an electrical field peak in the vertical channel when the vertical string driver is in an off state. The processing can connect the channel to the top conductor or the drain conductor, at 920.

Figure 10:
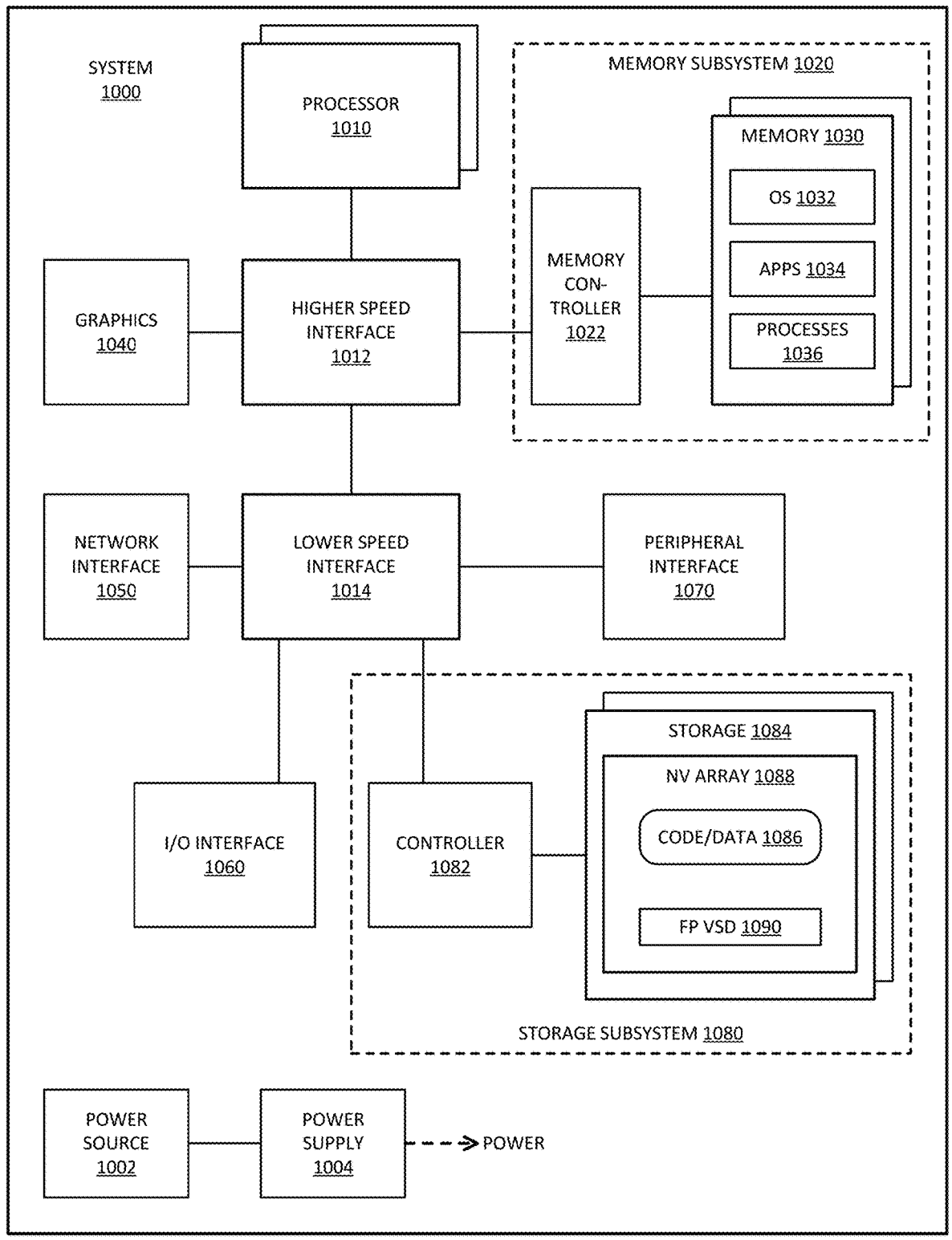
FIG. 10 is a block diagram of an example of a computing system in which a three dimensional memory with a vertical string driver with field management structure can be implemented.

FIG. 10 is a block diagram of an example of a computing system in which a three dimensional memory with a vertical string driver with field management structure can be implemented. System 1000 represents a computing device in accordance with any example herein, and can be a laptop computer, a desktop computer, a tablet computer, a server, a gaming or entertainment control system, embedded computing device, or other electronic device. System 1000 provides an example of a system that can include an SSD in accordance with system 802 or system 804, or another 3D stacked device with a vertical string driver having field management structure in accordance with circuit 100, circuit 202, or circuit 204.

In one example, system 1000 includes storage 1084 with NV array 1088. NV array 1088 can be, for example, a 3D NAND array. NV array 1088 includes a staircase structure with vertical string drivers in accordance with any example herein. FP VSD 1090 represents field plate vertical string drivers, which represent vertical string drivers with field management structures. FP VSD 1090 can be a string driver circuit to control current from a connector trace to an exposed connection of a wordline in the staircase region of the NV array 1088.

System 1000 includes processor 1010 can include any type of microprocessor, central processing unit (CPU), graphics processing unit (GPU), processing core, or other processing hardware, or a combination, to provide processing or execution of instructions for system 1000. Processor 1010 can be a host processor device. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 1000 includes interface 1012 coupled to processor 1010, which can represent a higher speed interface or a high throughput interface for system components that need higher bandwidth connections, such as memory subsystem 1020 or graphics interface components 1040. Interface 1012 represents an interface circuit, which can be a standalone component or integrated onto a processor die. Interface 1012 can be integrated as a circuit onto the processor die or integrated as a component on a system on a chip. Where present, graphics interface 1040 interfaces to graphics components for providing a visual display to a user of system 1000. Graphics interface 1040 can be a standalone component or integrated onto the processor die or system on a chip. In one example, graphics interface 1040 can drive a high definition (HD) display or ultra high definition (UHD) display that provides an output to a user. In one example, the display can include a touchscreen display. In one example, graphics interface 1040 generates a display based on data stored in memory 1030 or based on operations executed by processor 1010 or both.

Memory subsystem 1020 represents the main memory of system 1000, and provides storage for code to be executed by processor 1010, or data values to be used in executing a routine. Memory subsystem 1020 can include one or more memory devices 1030 such as read-only memory (ROM), flash memory, one or more varieties of random-access memory (RAM) such as DRAM, 3DXP (three-dimensional crosspoint), or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010, such as integrated onto the processor die or a system on a chip.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1000 includes interface 1014, which can be coupled to interface 1012. Interface 1014 can be a lower speed interface than interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can exchange data with a remote device, which can include sending data stored in memory or receiving data to be stored in memory.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, 3DXP, or optical based disks, or a combination. Storage 1084 holds code or instructions and data 1086 in a persistent state (i.e., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one example, storage subsystem 1080 includes controller 1082 to interface with storage 1084. In one example controller 1082 is a physical part of interface 1014 or processor 1010, or can include circuits or logic in both processor 1010 and interface 1014.

Power source 1002 provides power to the components of system 1000. More specifically, power source 1002 typically interfaces to one or multiple power supplies 1004 in system 1000 to provide power to the components of system 1000. In one example, power supply 1004 includes an AC to DC (alternating current to direct current) adapter to plug into a wall outlet. Such AC power can be renewable energy (e.g., solar power) power source 1002. In one example, power source 1002 includes a DC power source, such as an external AC to DC converter. In one example, power source 1002 or power supply 1004 includes wireless charging hardware to charge via proximity to a charging field. In one example, power source 1002 can include an internal battery or fuel cell source.

Figure 11:
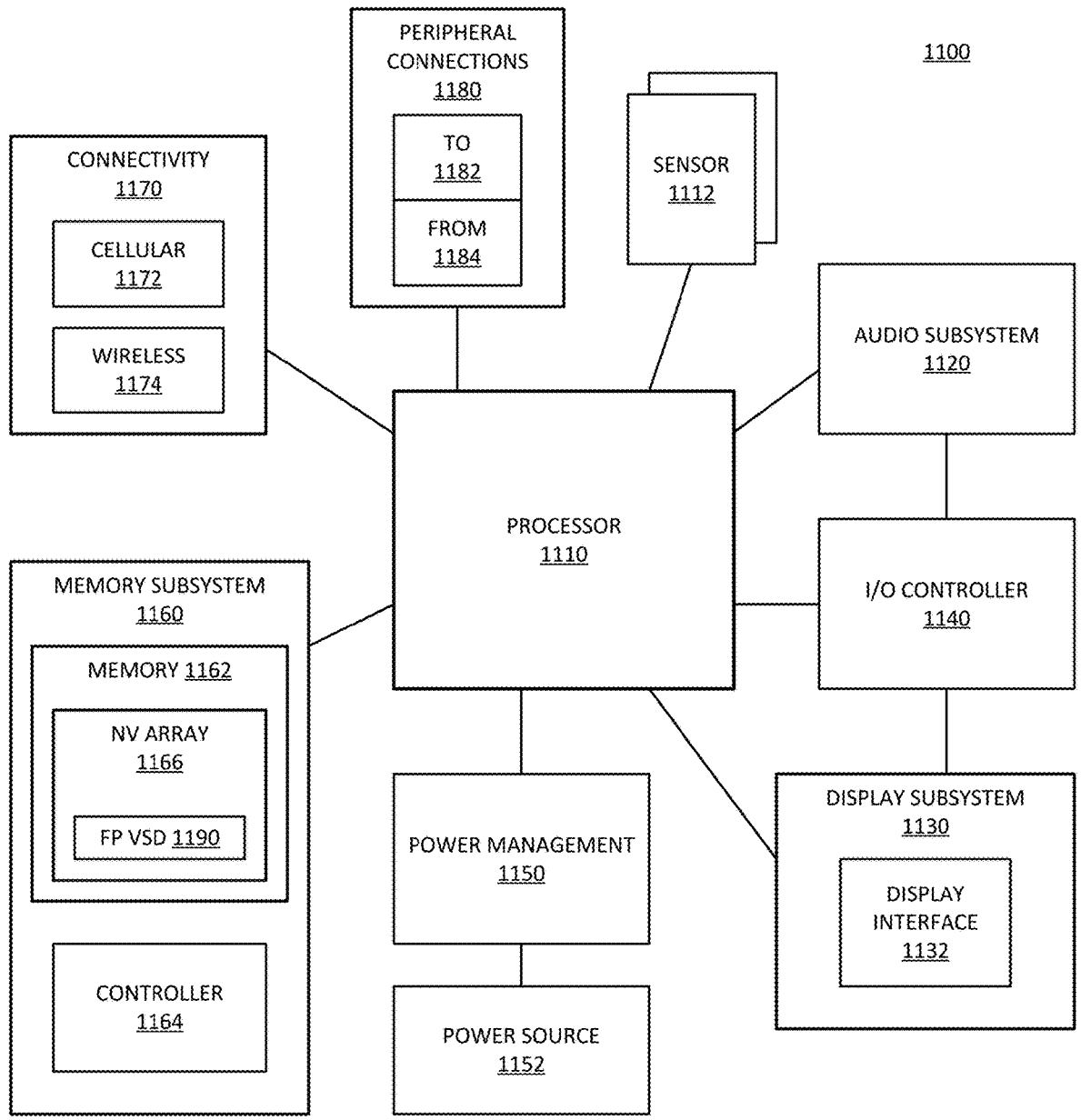
FIG. 11 is a block diagram of an example of a mobile device in which a three dimensional memory with a vertical string driver with field management structure can be implemented.

FIG. 11 is a block diagram of an example of a mobile device in which a three dimensional memory with a vertical string driver with field management structure can be implemented. System 1100 represents a mobile computing device, such as a computing tablet, a mobile phone or smartphone, wearable computing device, or other mobile device, or an embedded computing device. It will be understood that certain of the components are shown generally, and not all components of such a device are shown in system 1100. System 1100 provides an example of a system that can include a 3D stacked device with a vertical string driver having field management structure in accordance with circuit 100, circuit 202, or circuit 204.

In one example, system 1000 includes memory 1162 with NV array 1166. NV array 1166 can be, for example, a 3D NAND array. NV array 1166 includes a staircase structure with vertical string drivers in accordance with any example herein. FP VSD 1190 represents field plate vertical string drivers, which represent vertical string drivers with field management structures. FP VSD 1190 can be a string driver circuit to control current from a connector trace to an exposed connection of a wordline in the staircase region of the NV array 1166.

System 1100 includes processor 1110, which performs the primary processing operations of system 1100. Processor 1110 can be a host processor device. Processor 1110 can include one or more physical devices, such as microprocessors, application processors, microcontrollers, programmable logic devices, or other processing means. The processing operations performed by processor 1110 include the execution of an operating platform or operating system on which applications and device functions are executed. The processing operations include operations related to I/O (input/output) with a human user or with other devices, operations related to power management, operations related to connecting system 1100 to another device, or a combination. The processing operations can also include operations related to audio I/O, display I/O, or other interfacing, or a combination. Processor 1110 can execute data stored in memory. Processor 1110 can write or edit data stored in memory.

In one example, system 1100 includes one or more sensors 1112. Sensors 1112 represent embedded sensors or interfaces to external sensors, or a combination. Sensors 1112 enable system 1100 to monitor or detect one or more conditions of an environment or a device in which system 1100 is implemented. Sensors 1112 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1112 can also include sensors for biometric systems such as fingerprint recognition systems, face detection or recognition systems, or other systems that detect or recognize user features. Sensors 1112 should be understood broadly, and not limiting on the many different types of sensors that could be implemented with system 1100. In one example, one or more sensors 1112 couples to processor 1110 via a frontend circuit integrated with processor 1110. In one example, one or more sensors 1112 couples to processor 1110 via another component of system 1100.

In one example, system 1100 includes audio subsystem 1120, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1100, or connected to system 1100. In one example, a user interacts with system 1100 by providing audio commands that are received and processed by processor 1110.

Display subsystem 1130 represents hardware (e.g., display devices) and software components (e.g., drivers) that provide a visual display for presentation to a user. In one example, the display includes tactile components or touchscreen elements for a user to interact with the computing device. Display subsystem 1130 includes display interface 1132, which includes the particular screen or hardware device used to provide a display to a user. In one example, display interface 1132 includes logic separate from processor 1110 (such as a graphics processor) to perform at least some processing related to the display. In one example, display subsystem 1130 includes a touchscreen device that provides both output and input to a user. In one example, display subsystem 1130 includes a high definition (HD) or ultra-high definition (UHD) display that provides an output to a user. In one example, display subsystem includes or drives a touchscreen display. In one example, display subsystem 1130 generates display information based on data stored in memory or based on operations executed by processor 1110 or both.

I/O controller 1140 represents hardware devices and software components related to interaction with a user. I/O controller 1140 can operate to manage hardware that is part of audio subsystem 1120, or display subsystem 1130, or both. Additionally, I/O controller 1140 illustrates a connection point for additional devices that connect to system 1100 through which a user might interact with the system. For example, devices that can be attached to system 1100 might include microphone devices, speaker or stereo systems, video systems or other display device, keyboard or keypad devices, buttons/switches, or other I/O devices for use with specific applications such as card readers or other devices.

As mentioned above, I/O controller 1140 can interact with audio subsystem 1120 or display subsystem 1130 or both. For example, input through a microphone or other audio device can provide input or commands for one or more applications or functions of system 1100. Additionally, audio output can be provided instead of or in addition to display output. In another example, if display subsystem includes a touchscreen, the display device also acts as an input device, which can be at least partially managed by I/O controller 1140. There can also be additional buttons or switches on system 1100 to provide I/O functions managed by I/O controller 1140.

In one example, I/O controller 1140 manages devices such as accelerometers, cameras, light sensors or other environmental sensors, gyroscopes, global positioning system (GPS), or other hardware that can be included in system 1100, or sensors 1112. The input can be part of direct user interaction, as well as providing environmental input to the system to influence its operations (such as filtering for noise, adjusting displays for brightness detection, applying a flash for a camera, or other features).

In one example, system 1100 includes power management 1150 that manages battery power usage, charging of the battery, and features related to power saving operation. Power management 1150 manages power from power source 1152, which provides power to the components of system 1100. In one example, power source 1152 includes an AC to DC (alternating current to direct current) adapter to plug into a wall outlet. Such AC power can be renewable energy (e.g., solar power, motion based power). In one example, power source 1152 includes only DC power, which can be provided by a DC power source, such as an external AC to DC converter. In one example, power source 1152 includes wireless charging hardware to charge via proximity to a charging field. In one example, power source 1152 can include an internal battery or fuel cell source.

Memory subsystem 1160 includes memory device(s) 1162 for storing information in system 1100. Memory subsystem 1160 can include nonvolatile (state does not change if power to the memory device is interrupted) or volatile (state is indeterminate if power to the memory device is interrupted) memory devices, or a combination. Memory 1160 can store application data, user data, music, photos, documents, or other data, as well as system data (whether long-term or temporary) related to the execution of the applications and functions of system 1100. In one example, memory subsystem 1160 includes memory controller 1164 (which could also be considered part of the control of system 1100, and could potentially be considered part of processor 1110). Memory controller 1164 includes a scheduler to generate and issue commands to control access to memory device 1162.

Connectivity 1170 includes hardware devices (e.g., wireless or wired connectors and communication hardware, or a combination of wired and wireless hardware) and software components (e.g., drivers, protocol stacks) to enable system 1100 to communicate with external devices. The external device could be separate devices, such as other computing devices, wireless access points or base stations, as well as peripherals such as headsets, printers, or other devices. In one example, system 1100 exchanges data with an external device for storage in memory or for display on a display device. The exchanged data can include data to be stored in memory, or data already stored in memory, to read, write, or edit data.

Connectivity 1170 can include multiple different types of connectivity. To generalize, system 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1174 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1180 include hardware interfaces and connectors, as well as software components (e.g., drivers, protocol stacks) to make peripheral connections. It will be understood that system 1100 could both be a peripheral device ("to" 1182) to other computing devices, as well as have peripheral devices ("from" 1184) connected to it. System 1100 commonly has a "docking" connector to connect to other computing devices for purposes such as managing (e.g., downloading, uploading, changing, synchronizing) content on system 1100. Additionally, a docking connector can allow system 1100 to connect to certain peripherals that allow system 1100 to control content output, for example, to audiovisual or other systems.

In addition to a proprietary docking connector or other proprietary connection hardware, system 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a driver circuit includes: a gate layer between a source conductor and a drain conductor, vertically separated from the source conductor by a first electrical isolation layer, and vertically separated from the drain conductor by a second electrical isolation layer, the gate layer including a gate conductor; a vertical channel intersecting the gate layer, the vertical channel including a channel conductor to connect vertically between the source conductor and the drain conductor, and an oxide layer between the channel conductor and the gate conductor; and a field plate extending from the gate layer into the second electrical isolation layer, parallel to the vertical channel, the field plate including a field plate conductor having a physical structure to trigger an electrical field peak in the vertical channel when a voltage differential exists between the source conductor and the drain conductor, and when the gate conductor is not biased.

In one example, the vertical channel conductor comprises n-type (electron-majority-carrier) doped polysilicon. In one example, the vertical channel conductor comprises doped metal oxide. In one example, the doped metal oxide comprises zinc oxide (ZnO). In one example, the gate conductor comprises p-type (hole-majority-carrier) doped polysilicon. In one example, the field plate conductor comprises p-type (hole-majority-carrier) doped polysilicon. In one example, the gate conductor has a higher doping density than the field plate conductor. In one example, the field plate comprises a staircase structure with at least two steps, with the staircase stepping away from the vertical channel and away from the gate conductor into the second isolation layer. In one example, the field plate conductor comprises p-type (hole-majority-carrier) doped polysilicon, with successive steps away from the gate conductor having lower doping density. In one example, the field plate comprises a first field plate structure and the field plate conductor comprises a first field plate conductor, the driver circuit further including: a second field plate structure extending from the gate layer into the first electrical isolation layer, the second field plate structure including a second field plate conductor having a physical structure to trigger an electrical field peak in the vertical channel when a voltage differential exists between the source conductor and the drain conductor, and when the gate conductor is not biased. In one example, the second field plate structure comprises a staircase structure with at least two steps, with the staircase stepping away from the vertical channel and away from the gate conductor into the first isolation layer.

In general with respect to the descriptions herein, in one example a NAND memory device includes: a three-dimensional (3D) NAND array, the 3D NAND array including cells vertically stacked in a staircase pattern, with steps in the staircase to expose connections to wordlines of the 3D NAND array; and a driver circuit to control current from a connector trace to an exposed connection to a wordline of the 3D NAND array, the driver circuit including: a gate layer between a source conductor and a drain conductor, vertically separated from the source conductor by a first electrical isolation layer, and vertically separated from the drain conductor by a second electrical isolation layer, the gate layer including a gate conductor, wherein the drain conductor is electrically connected to the connector trace and the source conductor is electrically connected to a conductive pillar that electrically connected to the exposed connection to the wordline; a vertical channel intersecting the gate layer, the vertical channel including a channel conductor to connect vertically between the source conductor and the drain conductor, and an oxide layer between the channel conductor and the gate conductor; and a field plate extending from the gate layer into the second electrical isolation layer, parallel to the vertical channel, the field plate including a field plate conductor having a physical structure to trigger an electrical field peak in the vertical channel when a voltage differential exists between the source conductor, and when the drain conductor and the gate conductor is not biased.

In one example, the vertical channel conductor comprises n-type (electron-majority-carrier) doped polysilicon or n-type doped metal oxide. In one example, the gate conductor comprises p-type (hole-majority-carrier) doped polysilicon, wherein the field plate conductor comprises p-type doped polysilicon, and wherein the gate conductor has a higher doping density than the field plate conductor. In one example, the field plate comprises a staircase structure with at least two steps, with the staircase stepping away from the vertical channel and away from the gate conductor into the second isolation layer. In one example, the field plate conductor comprises p-type (hole-majority-carrier) doped polysilicon, with successive steps away from the gate conductor having lower doping density. In one example, the field plate comprises a first field plate structure and the field plate conductor comprises a first field plate conductor, the NAND device further including: a second field plate structure extending from the gate layer into the first electrical isolation layer, the second field plate structure including a second field plate conductor having a physical structure to trigger an electrical field peak in the vertical channel when a voltage differential exists between the source conductor and the drain conductor, and when the gate conductor is not biased.

In one example, the second field plate structure comprises a staircase structure with at least two steps, with the staircase stepping away from the vertical channel and away from the gate conductor into the first isolation layer. In one example, the driver circuit comprises a driver circuit at a top of the 3D NAND array staircase.

In general with respect to the descriptions herein, in one example a method for creating a driver device includes: forming a first electrical isolation layer on a source conductor; forming a gate conductor on the first electrical isolation layer; forming a field plate conductor on the gate conductor; forming a second electrical isolation layer on the field plate conductor and the gate conductor; forming a vertical channel through the second electrical isolation layer, the gate conductor, and the first electrical isolation layer, the vertical channel having a channel conductor to electrically contact the source conductor, and an oxide to electrically isolate the channel conductor from the gate conductor; and forming a drain conductor to electrically contact the channel conductor; wherein a physical structure of the field plate conductor is to trigger an electrical field peak in the vertical channel when a voltage differential exists between the source conductor and the drain conductor, and when the gate conductor is not biased.

In one example, forming the field plate conductor comprises forming a staircase structure with at least two steps, with the staircase stepping away from a space of the vertical channel and away from the gate conductor into the second isolation layer. In one example, forming the field plate conductor comprises forming a second field plate conductor, and further comprising: forming a first field plate conductor in the first electrical isolation layer, wherein forming the gate conductor comprises forming the gate conductor on the first field plate conductor and the first electrical isolation layer.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A driver circuit comprising:
  a gate layer between a source conductor and a drain conductor, vertically separated from the source conductor by a first electrical isolation layer, and vertically separated from the drain conductor by a second electrical isolation layer;

a vertical channel intersecting the gate layer, the vertical channel including a vertical channel semiconductor material to connect vertically between the source conductor and the drain conductor, and a gate oxide between the channel semiconductor material and the gate conductor, surrounding the channel semiconductor material, wherein the gate conductor contacts the gate oxide; and a field plate electrically coupled to the gate layer and extending from the gate layer into the second electrical isolation layer, parallel to the vertical channel, wherein the field plate has a staircase structure with at least two steps, where the field plate does not contact the gate oxide, and the staircase steps increase the vertical thickness of the field plate farther into the second isolation layer as the field plate extends farther away from the vertical channel, the field plate including a field plate conductor having a physical structure to trigger an additional electrical field peak in the vertical channel when a voltage differential exists between the source conductor and the drain conductor, and when the gate conductor is not biased, the additional electrical field peak in addition to an electrical field peak in the vertical channel due to the gate layer.

2. The driver circuit of claim 1, wherein the vertical channel semiconductor material comprises n-type (electron-majority-carrier) doped polysilicon.

3. The driver circuit of claim 1, wherein the vertical channel semiconductor material comprises doped metal oxide.

4. The driver circuit of claim 3, wherein the doped metal oxide comprises zinc oxide (ZnO).

5. The driver circuit of claim 1, wherein the gate conductor comprises p-type (hole-majority-carrier) doped polysilicon.

6. The driver circuit of claim 5, wherein the field plate conductor comprises p-type (hole-majority-carrier) doped polysilicon.

7. The driver circuit of claim 6, wherein the gate conductor has a higher doping density than the field plate conductor.

8. The driver circuit of claim 1, wherein the field plate conductor comprises p-type (hole-majority-carrier) doped polysilicon, with successive steps away from the gate conductor having lower doping density.

9. The driver circuit of claim 1, wherein the field plate comprises a first field plate structure, the staircase structure comprises a first staircase structure, and the field plate conductor comprises a first field plate conductor, and further comprising:

a second field plate structure extending from the gate layer into the first electrical isolation layer, wherein the second field plate has a second staircase structure with at least two steps, where the second field plate does not contact the gate oxide, and the second staircase steps increase the vertical thickness of the second field plate farther into the first isolation layer as the second field plate extends farther away from the vertical channel, the second field plate structure including a second field plate conductor having a physical structure to trigger an electrical field peak in the vertical channel when a voltage differential exists between the source conductor and the drain conductor, and when the gate conductor is not biased.

10. A NAND memory device, comprising:

a three-dimensional (3D) NAND array, the 3D NAND array including cells vertically stacked in a staircase pattern, with steps in the staircase to expose connections to wordlines of the 3D NAND array; and a driver circuit to control current from a connector trace to an exposed connection to a wordline of the 3D NAND array, the driver circuit including:

a gate layer between a source conductor and a drain conductor, vertically separated from the source conductor by a first electrical isolation layer, and vertically separated from the drain conductor by a second electrical isolation layer, the gate layer including a gate conductor, wherein the drain conductor is electrically connected to the connector trace and the source conductor is electrically connected to a conductive pillar that electrically connected to the exposed connection to the wordline;

a vertical channel intersecting the gate layer, the vertical channel including a vertical channel semiconductor material to connect vertically between the source conductor and the drain conductor, and a gate oxide between the channel semiconductor material and the gate conductor, surrounding the channel semiconductor material, wherein the gate conductor contacts the gate oxide; and a field plate electrically coupled to the gate layer and extending from the gate layer into the second electrical isolation layer, parallel to the vertical channel, wherein the field plate has a staircase structure with at least two steps, where the field plate does not contact the gate oxide, and the staircase steps increase the vertical thickness of the field plate farther into the second isolation layer as the field plate extends farther away from the vertical channel, the field plate including a field plate conductor having a physical structure to trigger an additional electrical field peak in the vertical channel when a voltage differential exists between the source conductor and the drain conductor, and when the gate conductor is not biased, the additional electrical field peak in addition to an electrical field peak in the vertical channel due to the gate layer.

11. The NAND memory device of claim 10, wherein the vertical channel semiconductor material comprises n-type (electron-majority-carrier) doped polysilicon or n-type doped metal oxide.

12. The NAND memory device of claim 10, wherein the gate conductor comprises p-type (hole-majority-carrier) doped polysilicon, wherein the field plate conductor comprises p-type doped polysilicon, and wherein the gate conductor has a higher doping density than the field plate conductor.

13. The NAND memory device of claim 10, wherein the field plate conductor comprises p-type (hole-majority-carrier) doped polysilicon, with successive steps away from the gate conductor having lower doping density.

14. The NAND memory device of claim 10, wherein the field plate comprises a first field plate structure, the staircase structure comprises a first staircase structure, and the field plate conductor comprises a first field plate conductor, and further comprising:

a second field plate structure extending from the gate layer into the first electrical isolation layer, wherein the second field plate has a second staircase structure with at least two steps, where the second field plate does not contact the gate oxide, and the second staircase steps increase the vertical thickness of the second field plate farther into the first isolation layer as the second field plate extends farther away from the vertical channel, the second field plate structure including a second field plate conductor having a physical structure to trigger an electrical field peak in the vertical channel when a voltage differential exists between the source conductor and the drain conductor, and when the gate conductor is not biased.

15. The NAND memory device of claim 10, wherein the driver circuit comprises a driver circuit at a top of the 3D NAND array staircase.

16. A method for creating a driver device, comprising:
forming a first electrical isolation layer on a source conductor;
forming a gate conductor on the first electrical isolation layer;
forming a field plate conductor on the gate conductor, the field plate electrically coupled to the gate conductor;
forming a second electrical isolation layer on the field plate conductor and the gate conductor;
forming a vertical channel through the second electrical isolation layer, the gate conductor, and the first electrical isolation layer, the vertical channel having a vertical channel semiconductor material to electrically contact the source conductor, and a gate oxide to electrically isolate the channel semiconductor material from the gate conductor, the gate oxide surrounding the channel semiconductor material, wherein the gate conductor contacts the gate oxide; and
forming a drain conductor to electrically contact the channel semiconductor material;
wherein the field plate has a staircase structure with at least two steps, where the field plate does not contact the gate oxide, and the staircase steps increase the vertical thickness of the field plate farther into the second isolation layer as the field plate extends farther away from the vertical channel; and
wherein a physical structure of the field plate conductor is to trigger an additional electrical field peak in the vertical channel when a voltage differential exists between the source conductor and the drain conductor, and when the gate conductor is not biased, the additional electrical field peak in addition to an electrical field peak in the vertical channel due to the gate conductor.

17. The method of claim 16, wherein forming the field plate conductor comprises forming a second field plate conductor in the first electrical isolation layer, and further comprising:
forming a first field plate conductor in the second electrical isolation layer, wherein forming the gate conductor comprises forming the gate conductor on the first field plate conductor and the first electrical isolation layer.

* * * * *

UNITED STATES PATENT AND TRADEMARK OFFICE
CERTIFICATE OF CORRECTION

PATENT NO. : 12,148,802 B2
APPLICATION NO. : 16/831558
DATED : November 19, 2024
INVENTOR(S) : Dong Ji, Guangyu Huang and Deepak Thimmegowda It is certified that error appears in the above-identified patent and that said Letters Patent is hereby corrected as shown below:

In the Claims

Claim 16 should read:
A method for creating a driver device, comprising:
  forming a first electrical isolation layer on a source conductor;
  forming a gate conductor on the first electrical isolation layer;
  forming a field plate conductor on the gate conductor, the field plate electrically coupled to the gate conductor;
  forming a second electrical isolation layer on the field plate conductor and the gate conductor;
  forming a vertical channel through the second electrical isolation layer, the gate conductor, and the first electrical isolation layer, the vertical channel having a vertical channel semiconductor material to electrically contact the source conductor, and a gate oxide to electrically isolate the channel semiconductor material from the gate conductor, the gate oxide surrounding the channel semiconductor material, wherein the gate conductor contacts the gate oxide; and
  forming a drain conductor to electrically contact the channel semiconductor material;
  wherein the field plate has a staircase structure with at least two steps, where the field plate does not contact the gate oxide, and the staircase steps increase the vertical thickness of the field plate farther into the second isolation layer as the field plate extends farther away from the vertical channel; and
  wherein a physical structure of the field plate conductor is to trigger an additional electrical field peak in the vertical channel when a voltage differential exists between the source conductor and the drain conductor, and when the gate conductor is not biased, the additional electrical field peak in addition to an electrical field peak in the vertical channel due to the gate conductor.

Signed and Sealed this
Fourteenth Day of January, 2025

Derrick Brent
*Acting Director of the United States Patent and Trademark Office*